US006796517B1

(12) United States Patent
Pike

(10) Patent No.: US 6,796,517 B1
(45) Date of Patent: Sep. 28, 2004

(54) APPARATUS FOR THE APPLICATION OF DEVELOPING SOLUTION TO A SEMICONDUCTOR WAFER

(75) Inventor: Christopher Lee Pike, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/522,226

(22) Filed: Mar. 9, 2000

(51) Int. Cl.[7] .................................. B05B 1/14
(52) U.S. Cl. ................. 239/557; 239/554; 239/567; 239/548; 427/240
(58) Field of Search .................. 239/554, 556, 239/557, 548, 561, 567; 427/240

(56) References Cited

U.S. PATENT DOCUMENTS

| | | | | |
|---|---|---|---|---|
| 943,172 A | * | 12/1909 | Ballreich | 239/567 |
| 2,249,274 A | * | 7/1941 | Faine | 239/556 |
| 3,027,888 A | * | 4/1962 | Du Fault et al. | 126/85 A |
| 3,116,880 A | * | 1/1964 | Kuiken | 239/539 |
| 3,192,989 A | * | 7/1965 | Miller | 431/287 |
| 4,056,229 A | * | 11/1977 | Jones | 239/288 |
| 4,416,213 A | | 11/1983 | Sakiya | 118/52 |
| 4,457,259 A | | 7/1984 | Samuels | 118/705 |
| 5,001,084 A | | 3/1991 | Kawai | 437/231 |
| 5,002,008 A | | 3/1991 | Ushijima | 118/313 |
| 5,020,200 A | | 6/1991 | Mimasaka | 29/25.01 |
| 5,089,305 A | | 2/1992 | Ushijima | 427/422 |
| 5,094,884 A | | 3/1992 | Hillman | 427/240 |
| 5,156,174 A | | 10/1992 | Thompson | 134/153 |
| 5,168,887 A | | 12/1992 | Thompson | 134/153 |
| 5,222,310 A | | 6/1993 | Thompson | 34/202 |
| 5,250,114 A | | 10/1993 | Konishi | 118/321 |
| 5,252,137 A | | 10/1993 | Tateyama | 134/34 |
| 5,275,658 A | | 1/1994 | Kimura | 118/302 |
| 5,312,039 A | | 5/1994 | Sayka | 239/1 |
| 5,374,312 A | | 12/1994 | Hasebe | 118/52 |
| 5,421,517 A | * | 6/1995 | Knudson et al. | 239/225.1 |
| 5,429,912 A | | 7/1995 | Neoh | 430/325 |
| 5,445,172 A | | 8/1995 | Thompson | 134/153 |
| 5,562,772 A | | 10/1996 | Neoh | 118/52 |
| 5,571,560 A | | 11/1996 | Lin | |
| 5,685,327 A | | 11/1997 | Mohindra et al. | 134/95.2 |
| 5,759,335 A | | 6/1998 | Lee et al. | 156/345 |
| 5,772,764 A | * | 6/1998 | Akimoto | 118/319 |

(List continued on next page.)

FOREIGN PATENT DOCUMENTS

JP 59-112872 B1 6/1984
JP 62-286225 B1 12/1987

OTHER PUBLICATIONS

Peter Van Zant, Microchip Fabrication—A Practical Guide to Semiconductor Processing, Third Edition, 1997 (front and back cover pages, pp. vii–xvi, 1, 96–119, 158–165, 191–309.
PCT International Search Report, International Application No. PCT/US01/06517, International Filing Date Feb. 27, 2001, Applicant's File Reference E0501PCT, 4 pages.

*Primary Examiner*—Dinh Q. Nguyen
(74) *Attorney, Agent, or Firm*—Eschweiler & Associates, LLC

(57) ABSTRACT

A wedge-shaped nozzle for dispensing fluids onto a round surface is disclosed. The nozzle dispenses the fluid with a generally uniform volume of fluid per unit area of the round surface to achieve rapidly a uniform thickness of applied fluid on the round surface. The wedge-shaped nozzle has orifices of equal size disposed on its bottom through which the fluid is dispensed. The orifices are disposed along arcs, with increasing numbers of orifices on the arcs at greater and greater distances of the arcs from the apex of the wedge-shaped nozzle. The numbers of the orifices on each arc are proportional to the area of an annular region determined by the arcs.

32 Claims, 25 Drawing Sheets

U.S. PATENT DOCUMENTS

| | | | |
|---|---|---|---|
| 5,845,170 A | 12/1998 | Ogata | 396/604 |
| 5,882,433 A | 3/1999 | Ueno | 134/31 |
| 5,885,755 A | 3/1999 | Nakagawa | 430/325 |
| 5,902,648 A | 5/1999 | Naka et al. | |
| 5,904,164 A | 5/1999 | Wagner | 134/148 |
| 5,912,054 A | 6/1999 | Tateyama | 427/425 |
| 5,919,520 A | 7/1999 | Tateyama | 427/240 |
| 5,922,138 A | 7/1999 | Shindo et al. | 134/2 |
| 5,954,877 A | 9/1999 | Hayes | 118/319 |
| 6,287,178 B1 * | 9/2001 | Huynh et al. | 239/556 |
| 2002/0046703 A1 * | 4/2002 | Templeton | 118/500 |

* cited by examiner

APPARATUS FOR THE APPLICATION OF DEVELOPING SOLUTION TO A SEMICONDUCTOR WAFER

BACKGROUND OF THE INVENTION

The present invention relates to the field of semiconductor integrated circuits. The invention is illustrated in an example with regard to a semiconductor integrated circuit wet processing method and apparatus, but it will be recognized by those of skill in other arts that the invention has a wider range of applicability. Merely by way of example, the invention can also be applied to the manufacture of raw wafers, disks and heads, flat panel displays, microelectronic masks, and other applications requiring high purity wet processing such as steps of rinsing, drying, and the like. The present invention generally relates to a nozzle and a method for dispensing process liquids onto a surface. More particularly, the present invention relates to a fluid dispense nozzle for dispensing fluids of photoresist developer chemicals, photoresist chemicals, cleaning and rinsing chemicals, etchant chemicals, or dielectric chemicals onto a rotating semiconductor substrate material.

Integrated circuits are typically constructed by depositing a series of individual layers of predetermined materials on a wafer shaped semiconductor substrate, or "wafer." The individual layers of the integrated circuit are in turn produced by a series of manufacturing steps. For example, in forming an individual circuit layer on a wafer containing a previously formed circuit layer, an oxide, such as silicon dioxide, is deposited over the previously formed circuit layer to provide an insulating layer for the circuit. A pattern for the next circuit layer is then formed on the wafer using a radiation alterable material, known as photoresist. Two very common families of photoresists are phenol-formaldehyde polymers and polyisoprene polymers.

Photoresist materials are generally composed of a mixture of organic resins, sensitizers and solvents. Sensitizers are compounds, such as bio-aryldiazide and o-naphthaquinone-diazide, that undergo a chemical change upon exposure to radiant energy, such as visible and ultraviolet light resulting in an irradiated material having differing solvation characteristics with respect to various solvents than the nonirradiated material. Resins are used to provide mechanical strength to the photoresist and the solvents serve to lower the viscosity of the photoresist so that it can be uniformly applied to the surface of the wafers.

After a photoresist layer is applied to the wafer surface, the solvents are evaporated and the photoresist layer is hardened, usually by heat treating the wafer. The photoresist layer is then selectively irradiated by placing a radiation opaque mask containing a transparent portion defining the pattern for the next circuit layer over the photoresist layer and then exposing the photoresist layer to radiation. The photoresist layer is then exposed to a chemical, known as developer, in which either the irradiated or the nonirradiated photoresist is soluble and the photoresist is removed in the pattern defined by the mask, selectively exposing portions of the underlying insulating layer. Common developers are tetramethyl ammonium hydroxide, sodium hydroxide, xylene and Stoddard solvent. After development rinsing is performed with fluids such as water or n-Butylacetate.

The exposed portions of the insulating layer are then selectively removed using an etchant to expose corresponding sections of the underlying circuit layer. The photoresist must be resistant to the etchant, so as to limit the attack of the etchant to only the exposed portions of the insulating layer.

Alternatively, the exposed underlying layer(s) may be implanted with ions which do not penetrate the photoresist layer thereby selectively penetrating only those portions of the underlying layer not covered by the photoresist. The remaining photoresist is then stripped using either a solvent, or a strong oxidizer in the form of a liquid or a gas in the plasma state. The next layer is then deposited and the process is repeated until fabrication of the semiconductor device is complete.

Photoresist solution, developer solution and other process liquids are typically applied to the wafer using a spin coating technique in which the process liquid is sprayed on the surface of the wafer as the wafer is spun on a rotating chuck. The spinning of the wafer distributes the liquid over the surface of the material. In particular, when developer chemicals are applied to the surface, it is necessary to quickly and gently produce a deep puddle of developer on the wafer to ensure that the photoresist layer is dissolved uniformly in areas that are soluble in the developer. In a developing process, among other manufacturing processes for a semiconductor device, a developer should be uniformly applied to a resist film on a semiconductor wafer within a predetermined time. The reason is that the developing uniformity for the resist film is generally supposed to depend on the state of development, so that the development is subject to irregularity unless the developer is first uniformly supplied to the whole surface of the wafer. Conventionally, therefore, liquid coating nozzles of various types have been proposed.

U.S. Pat. No. 4,267,212 discloses a process for spin coating a semiconductor wafer uniformly with a coating solution such as a photographic emulsion by rotating the wafer at a first speed while simultaneously applying the coating solution through a circular nozzle at a radially moving position. Once the semiconductor wafer has been initially covered, the speed of rotation of the wafer is increased and rotation continues until a uniform coating has been obtained. A similar process having a stationary nozzle is disclosed in U.S. Pat. No. 3,695,928.

In each of the aforedescribed apparatuses and methods, the fluid coating material is dispensed in a column of fluid whose cross-section approximates a circle, either during wafer rotation or while the wafer is stationary. Wafer coating is achieved by building up a pool of the fluid coating material in the nature of a thick layer and spin casting a film thereof by accelerating the rotation of the wafer about its own center in order to remove the excess material and to leave a thin film coating therebehind. The amount of fluid coating material, such as photoresist, remaining on the wafer is known to be a very small fraction of the amount that is initially dispensed, approximately one part in one thousand. This results in a substantial material loss of unusable photoresist along with its attendant cost. In addition, this creation of a pool of the fluid coating material on the wafer surface can result in the formation of uneven films which might adversely effect subsequent wafer processing.

Very specifically, in the prior art, a variety of devices, called nozzles, are used to apply fluids to a wafer surface. In FIG. 1, a simple spout nozzle 5 is depicted with an orifice 10 at the end of a spout attached to a fluid supply tube 15. The nozzle is positioned above the center of a rotating wafer 20 shown in the plan view.

FIG. 2 depicts a side view of this device dispensing fluid 31 onto the wafer 20 supported by a spin chuck 33 connected to a motor (not shown) that rotates the chuck and thus the wafer. In this nozzle 5, the fluid reaches the wafer center 35 first and only gradually is dispersed by centrifugal force to the perimeter 37 of the wafer. In fact, even after distribution to the perimeter, a greater amount of developer remains near the center 35 as shown in FIG. 3.

FIG. 4 depicts a cross-sectional view along a longitudinal axis of another version of the prior art, known as a block nozzle 55, which tries to solve some of the difficulties of the spout nozzle. In this case, the block nozzle 55 is a rectangular vessel 40 with an interior 42 serving as a liquid reservoir. The nozzle's top surface 44 has two inlet fittings 46A, B for attachment to a fluid supply tube 48A, B, a support 41 for connection to an external apparatus not depicted, and an outlet fitting 43 for attachment to a gas outlet tube. The bottom 45 of the nozzle has a portion downwardly projecting called a nozzle tip 47 with a multiplicity of openings or orifices, e.g., 49, out of which the fluid is dispensed.

FIG. 5 depicts a transverse cross-section of the block nozzle 55. The figure shows the orifices, e.g. 49, in fluid communication with the vessel's interior 42 through a slit 51 in the nozzle tip 47 and small passages 53 in the bottom wall of the interior. The nozzle tip and its orifices are arranged on the nozzle in a row approximately the diameter of the wafer, and each of the orifices have similar opening areas.

FIG. 6, in bottom plan view looking upwards from a rotating wafer 20 below the block nozzle 55, shows the block nozzle with its row of orifices 49A–I. A variation of the block nozzle is the partial-block nozzle 57 depicted in bottom plan view looking upwards from a rotating wafer 20 in FIG. 7. The difference between the block and partial-block nozzle is apparent by comparison to the wafer diameter. The partial-block nozzle is only about half the length of the block nozzle, and when placed over the wafer, extends about one wafer radial length from the center to the perimeter 59. The cross-sectional views of the partial-block nozzle 57, along both its longitudinal axis and its transverse axis, would be similar to the cross-sectional views of the block nozzle 55 shown in FIG. 4 and FIG. 5.

Unlike the spout nozzle, the block nozzle and partial-block nozzle dispense fluid near the perimeter 59 of the wafer and at points between the perimeter and center 52 at the same time that those two nozzles dispense fluid to the center of the wafer, thereby solving the most extreme difficulty of the spout nozzle. However, despite the improvement in uniform distribution of the dispensed fluid on the wafer, substantial non-uniformity persists.

To understand the cause of the persisting non-uniformity, suppose the wafer is 8 inches in diameter, suppose that the nozzle is of the partial-block design, and suppose that there are four equally-spaced orifices of equal opening area. Suppose further that in FIG. 7 the nozzle is placed so that one end orifice 54E overlies the center of the wafer 52, while the other end orifice 54A overlies a wafer region just inside the wafer's perimeter 59. The first end orifice dispenses fluid onto the wafer's center while each of the other three orifices dispenses fluid onto a separate annulus.

FIG. 8 shows a circular region 60 of one inch radius and three concentric annular regions 62, 64 and 66 of inner and outer radii, respectively, of 1" and 2", 2" and 3", and 3" and 4". The area of each annulus is $\pi \, (r^2_{outer} - r^2_{inner})$ and, accordingly, FIG. 9 shows the area 61 of the 1" circle 68 and the three successive annuluses as a function of the radius 63 of the circle and the outer radius of the three annuluses. From FIG. 9 it is evident that the area of the circle is 1/7th of the outer-most annulus. Accordingly, assuming approximately equal fluid flow per unit time through the opening of each orifice, the fluid dispensed from the central orifice 54E in FIG. 7 is spread over an area only 1/7th that of the fluid dispensed from the orifice nearest the wafer's perimeter 54A. As a result, assuming for simplicity fluid dispensed over the circle 68 remains in the circle and fluid dispensed over the perimeter annulus 66 remains there, serious non-uniformity with a radial dependence exists because the average thickness of the dispensed fluid over the center circle is seven times that over the perimeter annulus. This non-uniformity will be further exaggerated as the semiconductor industry over time employs wafers of ever-increasing diameter. As a result, over-development can occur in the wafer center compared to the wafer perimeter.

The timing of the application of developer fluid to the wafer can also affect the uniformity of the results of development. For example, chemically amplified photoresists tend to develop much more rapidly than non-chemically amplified photoresists. The speed of chemically amplified photoresists can be as little as one second. That time is often less than the time required to apply the developing solution to the entire wafer surface. Consequently, if some portions of the wafer are covered with developer earlier than other portions, the developing process will proceed to a farther stage at those earlier portions in a given amount of time.

In the use of the partial-block design described in FIG. 7, the center circle 68 is covered with at least some fluid at the onset of fluid dispensing, while the perimeter annulus 66 receives fluid along its full extent only at the end of one revolution of the wafer spun by the chuck. Accordingly, if the fluid is developer, development begins much sooner on the center circle than at many portions of the wafer perimeter. That development might even run to completion much sooner at the central circle than in the perimeter annulus in the event chemically-amplified photoresists are used, for the reasons discussed above.

Accordingly, there is a need for a nozzle which applies fluid uniformly per unit wafer area to wafer portions of increasing distance from the center to produce more uniform thickness of the dispensed fluid over the whole wafer area and therefore more uniform photoresist layers and more uniform development processes.

Moreover, there is a need for more rapid application of the wafer fluid to wafer regions distant from the wafer center. That more rapid application will produce more uniform development times from the beginning of fluid dispensing independent of the distance of the wafer region from the wafer center.

Accordingly, there is an unsolved need for an apparatus which minimizes consumption of the coating material, such as photoresist, during spin casting and the like, as well as providing a more uniform and more rapidly applied thin film coating on semiconductor wafers during the fabrication of integrated circuits and other electronic components therefrom in the semiconductor industry.

Thus, it is apparent that a need exists for an improved nozzle for spin dispensing apparatuses which overcomes, among others, the above-discussed problems so as to produce a more uniform and more rapidly applied layer of process liquid over the surface of the wafer.

SUMMARY OF THE INVENTION

The present invention is defined by the following claims, and nothing in this section should be taken as a limitation on those claims. By way of introduction, the preferred embodiments described below relate to a wedge-shaped nozzle for dispensing fluids onto a round surface with a generally uniform volume of fluid per unit area of the round surface to achieve rapidly a uniform thickness of applied fluid on the round surface. The wedge-shaped nozzle has orifices of equal size disposed on its bottom through which the fluid is dispensed. The orifices are disposed along arcs, with increasing numbers of orifices on the arcs at greater and greater distances of the arcs from the apex of the wedge-shaped nozzle. The numbers of the orifices on each arc are proportional to the area of an annular region determined by the arcs.

Accordingly, the present invention provides an improved nozzle that allows process liquid to be dispensed more uniformly on a rotating surface, which provides for a more uniform distribution of the process liquid on the surface of the layer, while requiring less process liquid and slower rotational speed to ensure full coverage of the surface.

One object of the present invention is to provide an apparatus for applying a thin layer of a fluid material such as photoresist or developer fluid on the surface of a wafer which eliminates pooling of the material.

Another object of the present invention is to provide an apparatus for applying a layer of a fluid material such as a photoresist or developer fluid on the surface of a wafer which reduces the amount of the material required for a given coating thickness.

Another object of the present invention is to provide an apparatus for applying a layer of a fluid material such as a photoresist or developer fluid on the surface of a wafer which enhances uniformity of coating thickness.

Another object of the present invention is to provide an apparatus which renders uniformity of fluid material application to a wafer more insensitive to greater and greater wafer diameters.

Another object of the present invention is to provide a photoresist application or developing treatment apparatus making it possible to form a resist pattern having a very small measurement error range and high precision and improve the yield rate of the resist pattern.

Another object of the invention is to provide a method for photoresist application or developing treatment making it possible to form a resist pattern having a very small measurement error range and high precision and improve the yield rate of the resist pattern.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore. These and other details, objects, and advantages of the invention will become apparent as the following detailed description of the present preferred embodiment thereof proceeds.

DETAILED DESCRIPTION OF THE INVENTION

Figure 1:
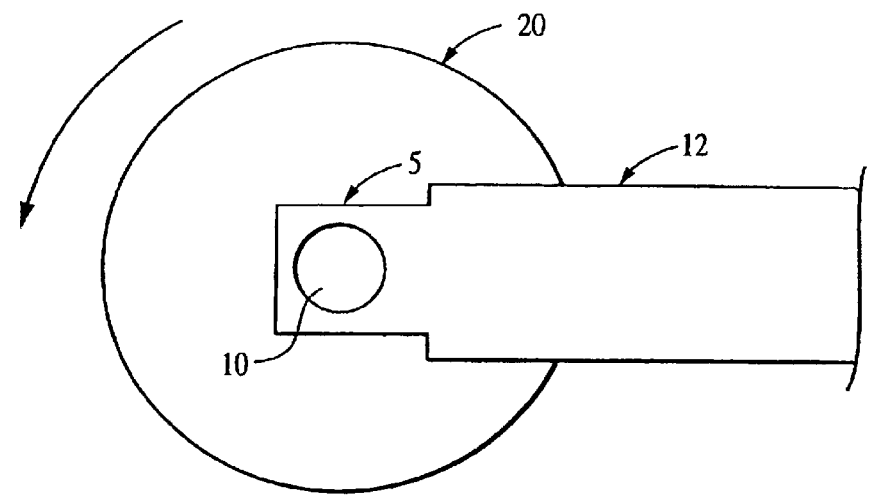
FIG. 1 is a bottom plan view of a spout nozzle looking upwards from a rotating wafer disposed below the spout nozzle and showing its orifice.
Figures 2, 3:
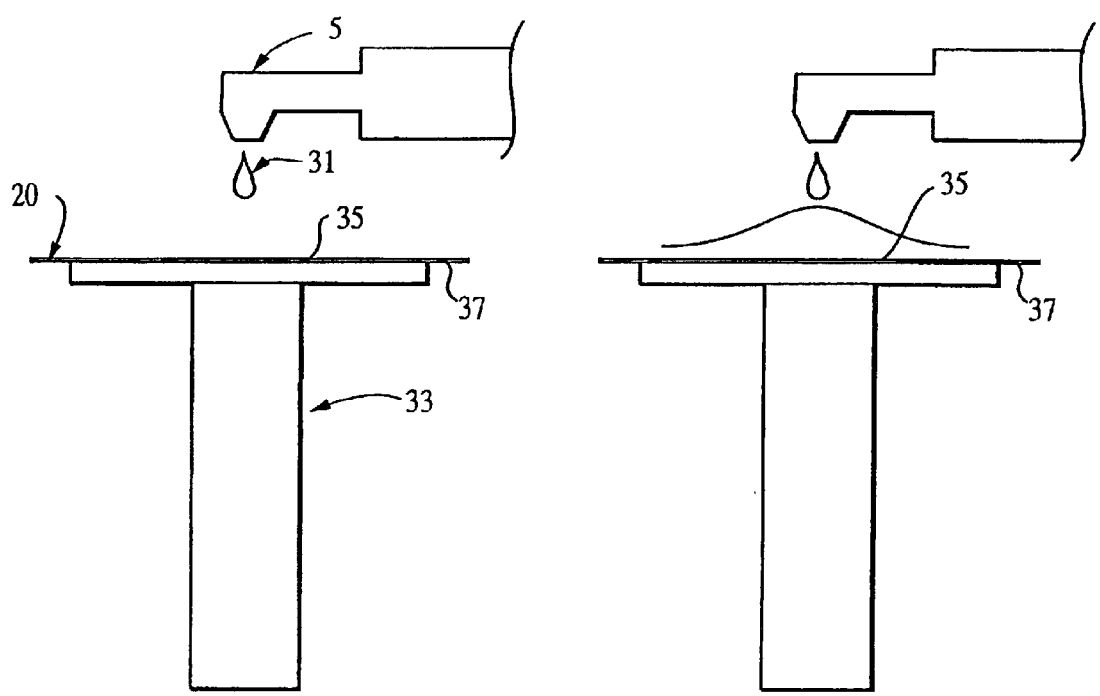
FIG. 2 is a side view of the spout nozzle.
FIG. 3 is a side view of the non-uniform distribution of fluid material on a wafer.
Figure 4:
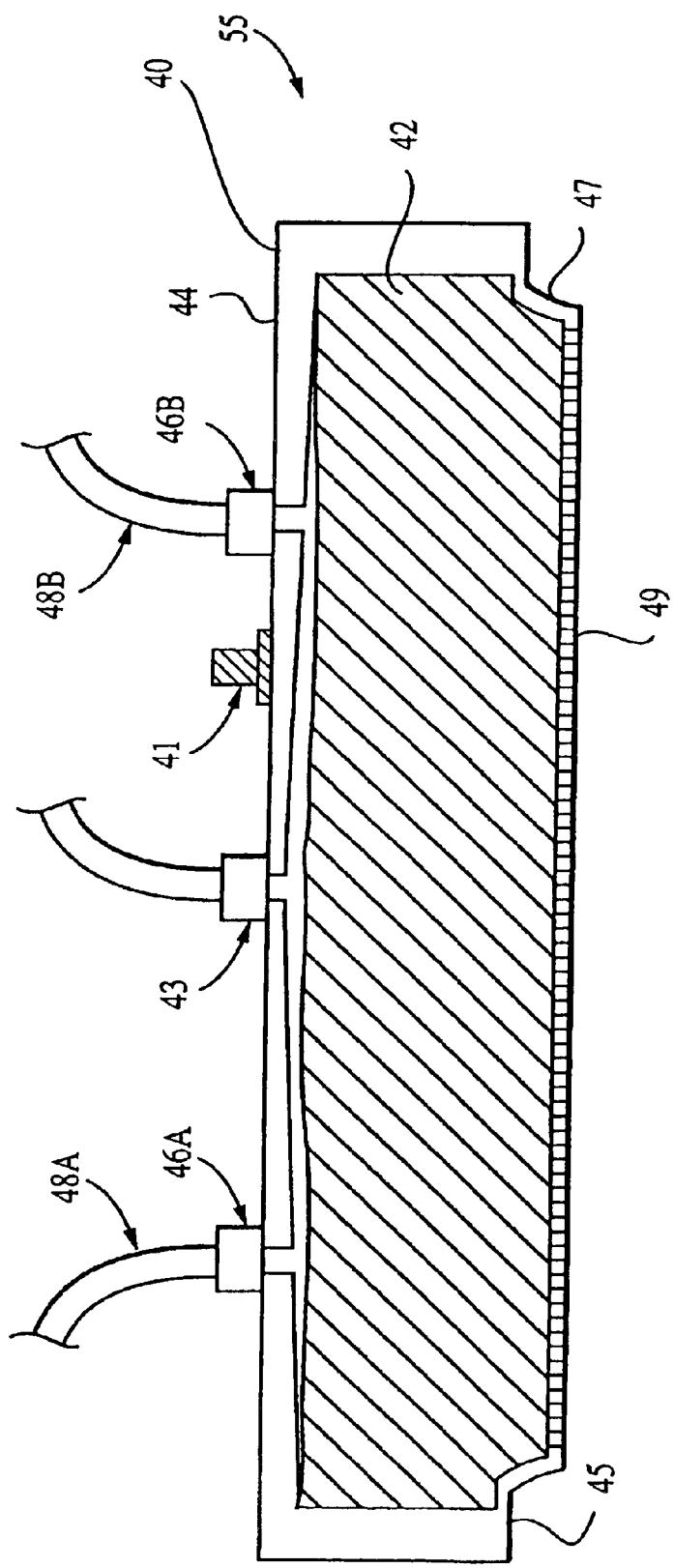
FIG. 4 is a longitudinal cross-sectional view of a prior art block nozzle.
Figure 5:
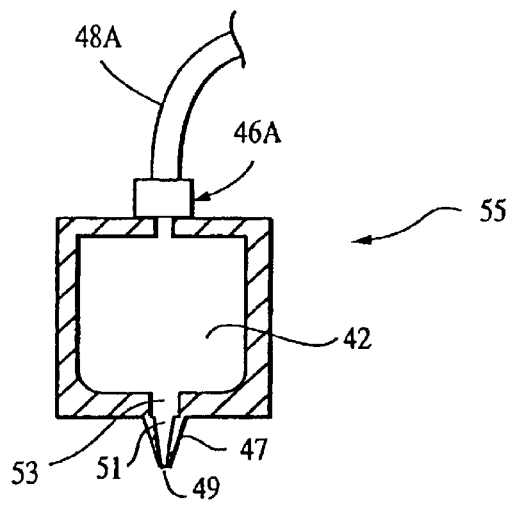
FIG. 5 is a transverse cross-section of the prior art block nozzle.
Figure 6:
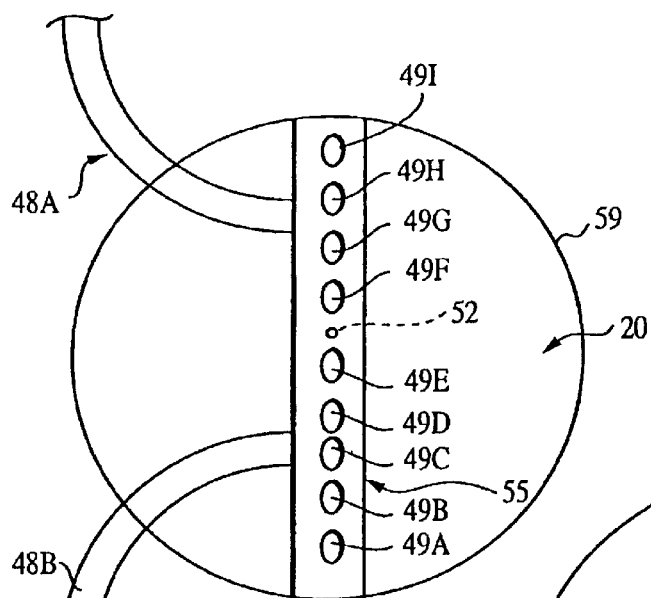
FIG. 6 is a bottom plan view of the prior art block nozzle showing its orifices looking upwards from a rotating wafer.
Figure 7:
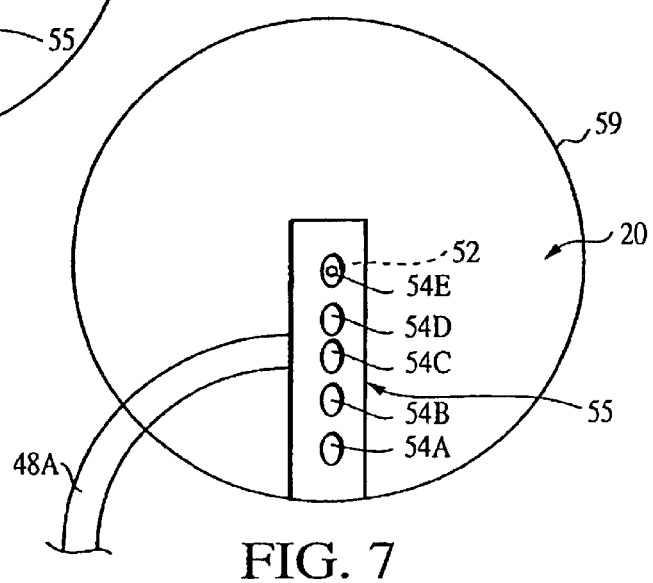
FIG. 7 is a bottom plan view of a prior art partial-block nozzle looking upwards from a rotating wafer disposed below the partial-block nozzle and showing its orifices.
Figure 8:
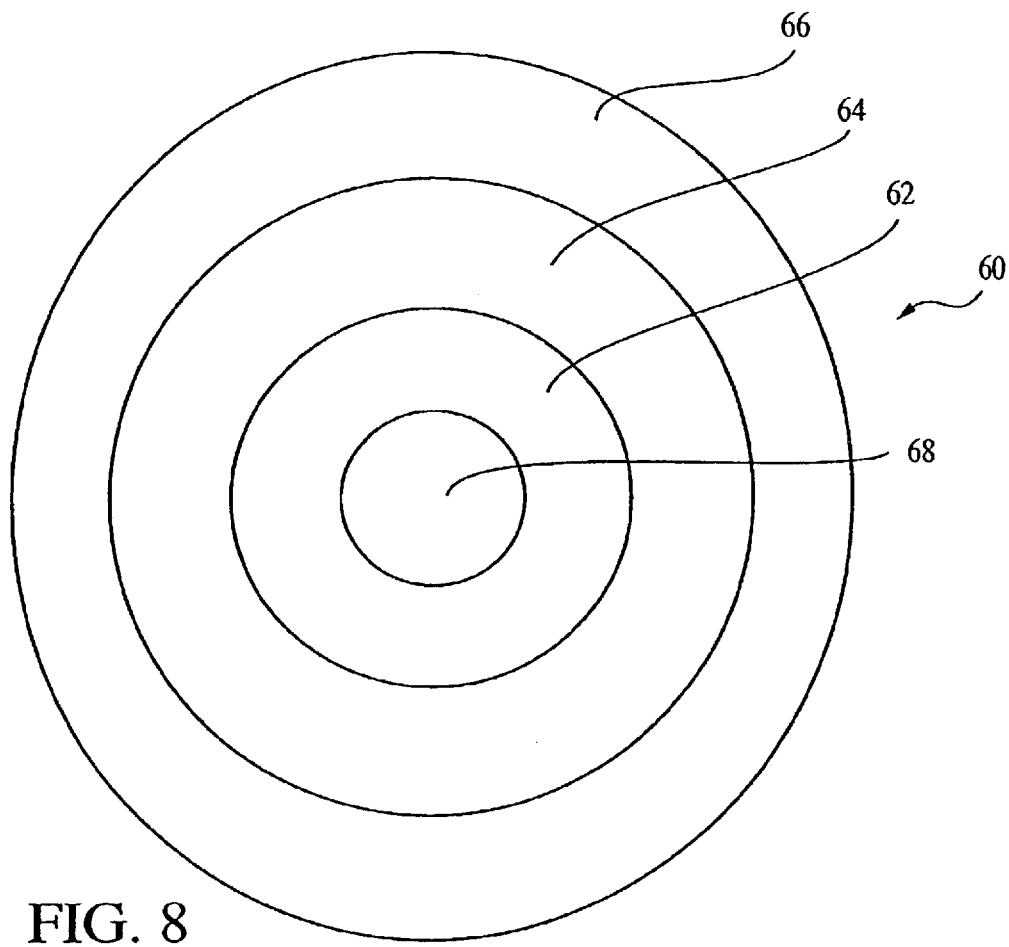
FIG. 8 is a top plan view of concentric annular regions of a wafer receiving dispensed fluid from the prior art partial-block nozzle.
Figure 9:
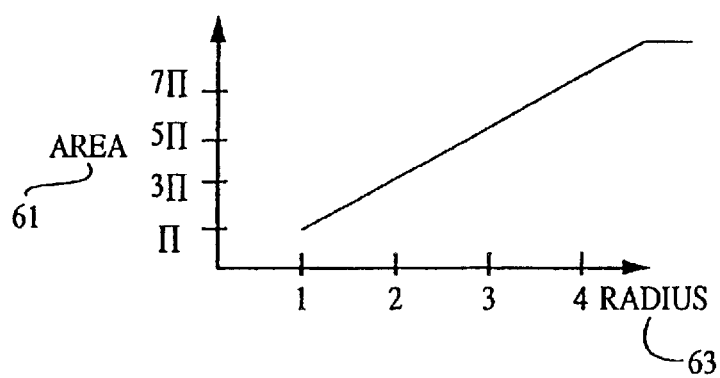
FIG. 9 is a graph depicting the areas of the circular region and annular regions of the wafer as a function of the radii of the regions.
Figure 10:
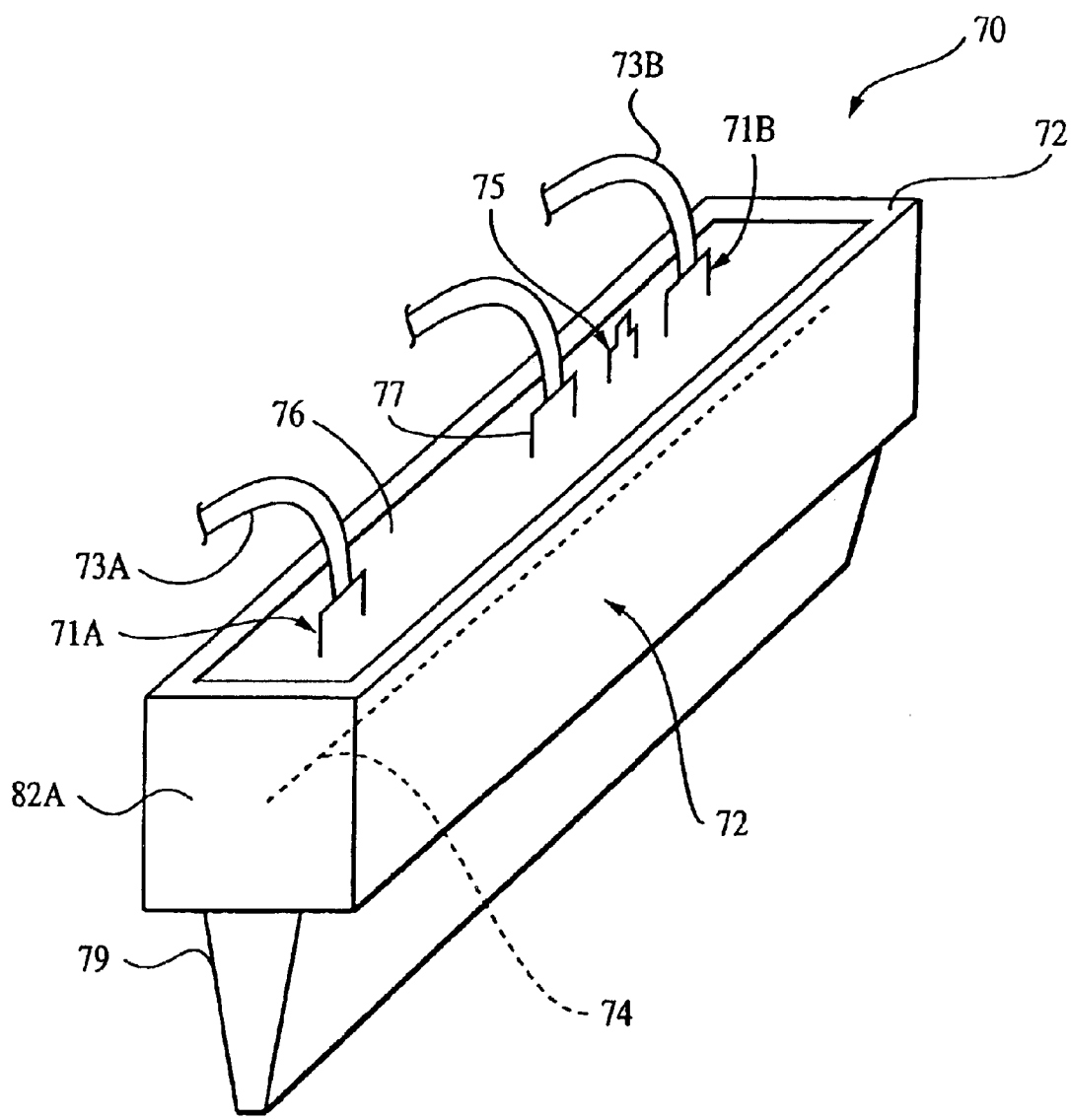
FIG. 10 is a perspective view of a first embodiment of the invention called a half-block nozzle.

FIG. 10 depicts a perspective view of a first embodiment of the invention known as a half-block nozzle 70. This embodiment is a generally rectangular vessel 72 with a longitudinal axis 74, a total surface and a generally rectangular top surface 76. Of course variations in this general shape will be readily apparent to those of ordinary skill in the art.

Figure 11:
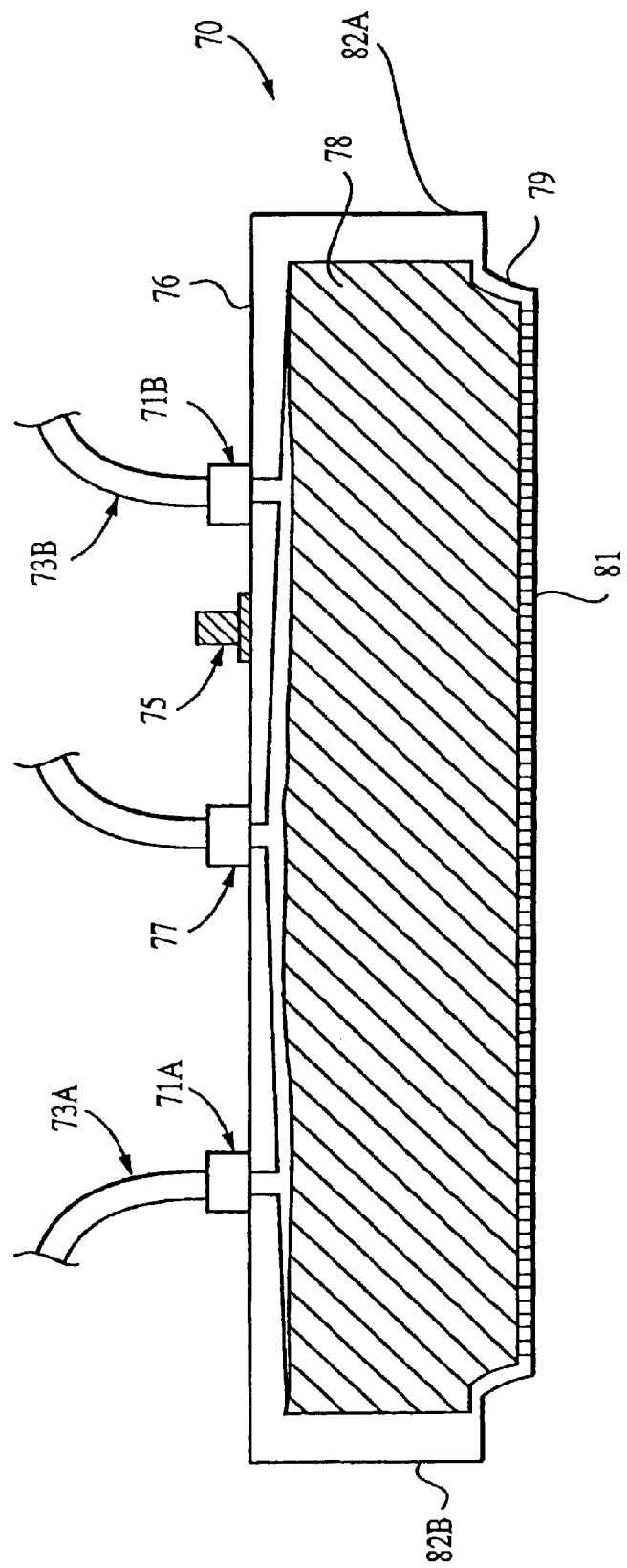
FIG. 11 is a longitudinal cross-sectional view of the half-block nozzle.

FIG. 11 depicts a cross-sectional view along the longitudinal axis 74 and perpendicular to the top surface 76 of this embodiment of the invention showing the interior 78 serving as a liquid reservoir. The half-block nozzle's top surface 76 has one or more inlet fittings 71 A, B for attachment to a fluid supply tube 73A, B, a support 75 for connection to an external apparatus (not depicted) to support the nozzle, and an outlet fitting 77 for attachment to a gas outlet tube. Nevertheless, it will be apparent to those of ordinary skill in the art that these items shown on the top surface may or may not be present in the numbers, or in the locations on the nozzle, or in fact may be entirely absent. The bottom of the nozzle has a portion downwardly projecting called a nozzle tip 79 with a multiplicity of openings or orifices, e.g., 81, out of which the fluid is dispensed. Again, it will be apparent to those of ordinary skill in the art that the orifices might be disposed on a bottom that has no nozzle tip.

Figure 12:
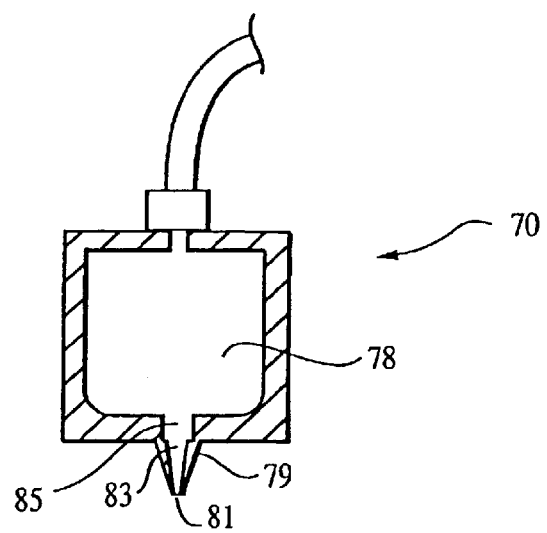
FIG. 12 is a transverse cross-sectional view of the half-block nozzle.

FIG. 12 depicts a transverse cross-section of the half-block nozzle 70. The figure shows one of the orifices 81 in fluid communication with the vessel's interior 78 through a slit 83 in the nozzle tip 79 and a small passage 85 in the bottom wall of the interior. The nozzle tip and its orifices are arranged on the nozzle in a row whose length is approximately half the diameter of the wafer.

Figure 13:
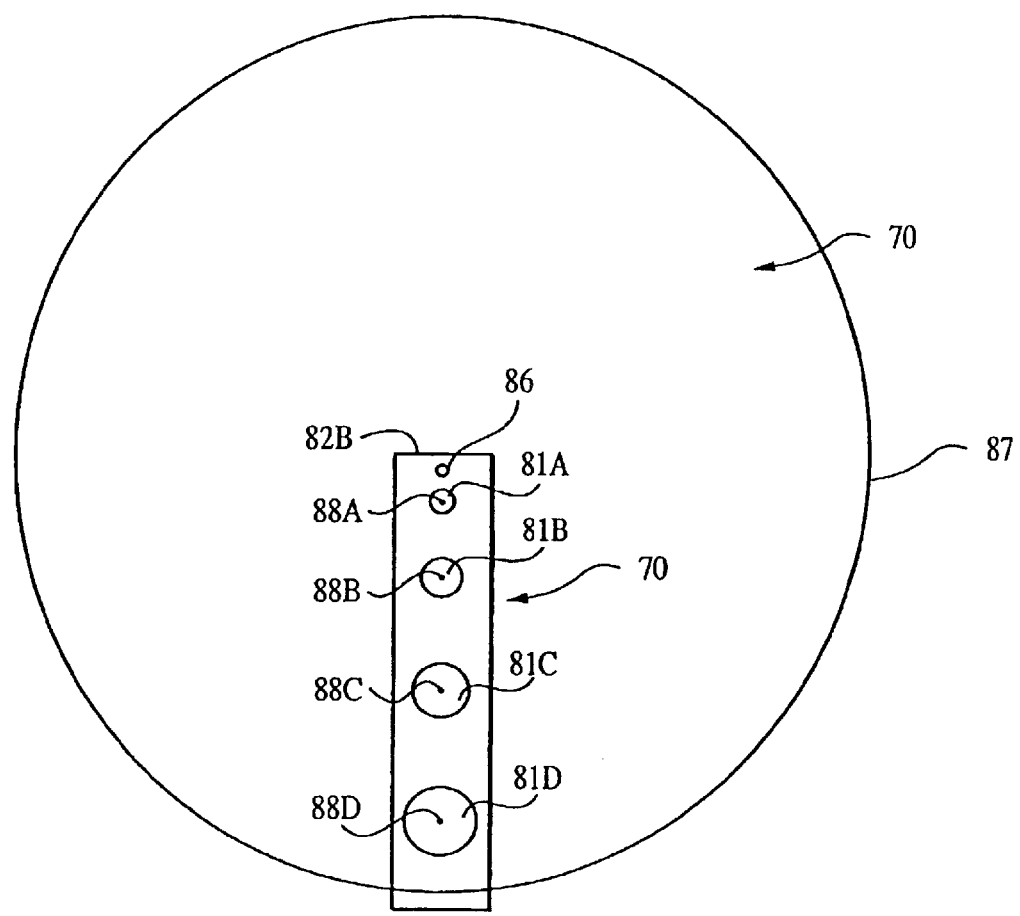
FIG. 13 is a bottom plan view of the half-block nozzle looking upwards from a wafer disposed below the half-block nozzle and showing its orifices.

FIG. 13, in bottom plan view looking upwards from a rotating wafer 20 below the half-block nozzle 70, shows the half-block nozzle with its row of orifices 81A–D. In this view and this orientation of the nozzle with respect to the wafer, the orifices face the wafer sufficiently to allow fluid dispensed from the orifices to contact the wafer surface with minimal disturbance of the desired dispensing process. Although the orifices 81A–D are depicted in FIG. 13 as being generally co-planar, circular in shape, and equidistant from each other in center-to-center distance, it will be apparent to those of ordinary skill in the art that the bottom may not be planar, the nozzle tip bottom ends in which the orifices are openings may not be co-planar, that the orifice centers 88A–D might not be equidistant from each other, and that the orifice shapes might not be planar or two-dimensional and, even if two-dimensional and planar, might be semi-circular, elliptical, square or hexagonal in shape or of some other shape altogether. The half-block nozzle 70, when placed over the wafer 20, extends about one wafer radial length from the wafer center 86 to the wafer perimeter 87. It will be apparent to one of skill in the art that the center of the one end orifice 88A might be placed substantially overlying the wafer center 86.

The central orifice 81 A is the orifice at one end of the row of orifices, i.e., the orifice closest to one of the two opposite side surfaces 82A, B depicted in FIGS. 10 and 11 and called the first side surface 82B. The characteristics of the nozzle are selected so that the volume of fluid flow per unit time through a given orifice exceeds, or is at least substantially equal to, the volume of fluid flow per unit time through any other orifice closer to the central orifice 81 A than the given orifice. As depicted in FIG. 13, the areas of the circular orifices increase along the row beginning with the central orifice. The increasing orifice areas is one nozzle characteristic that can produce the result of generally increasing, or non-decreasing, volume of fluid flow just described. However, it will be apparent to those of ordinary skill in the art that other characteristics of the nozzle, including its nozzle tips and small passages, can produce pressure, viscosity and other physical effects with the same result.

More particularly, this embodiment can be employed so that the first side surface 82B is that one of the two opposite side surfaces closest to the center 86 of the wafer. So utilized, the half-block nozzle provides greater uniformity of dispensed fluid on the wafer than the prior art by providing greater amounts of fluid into annular regions of the wafer with greater area.

Figure 14:
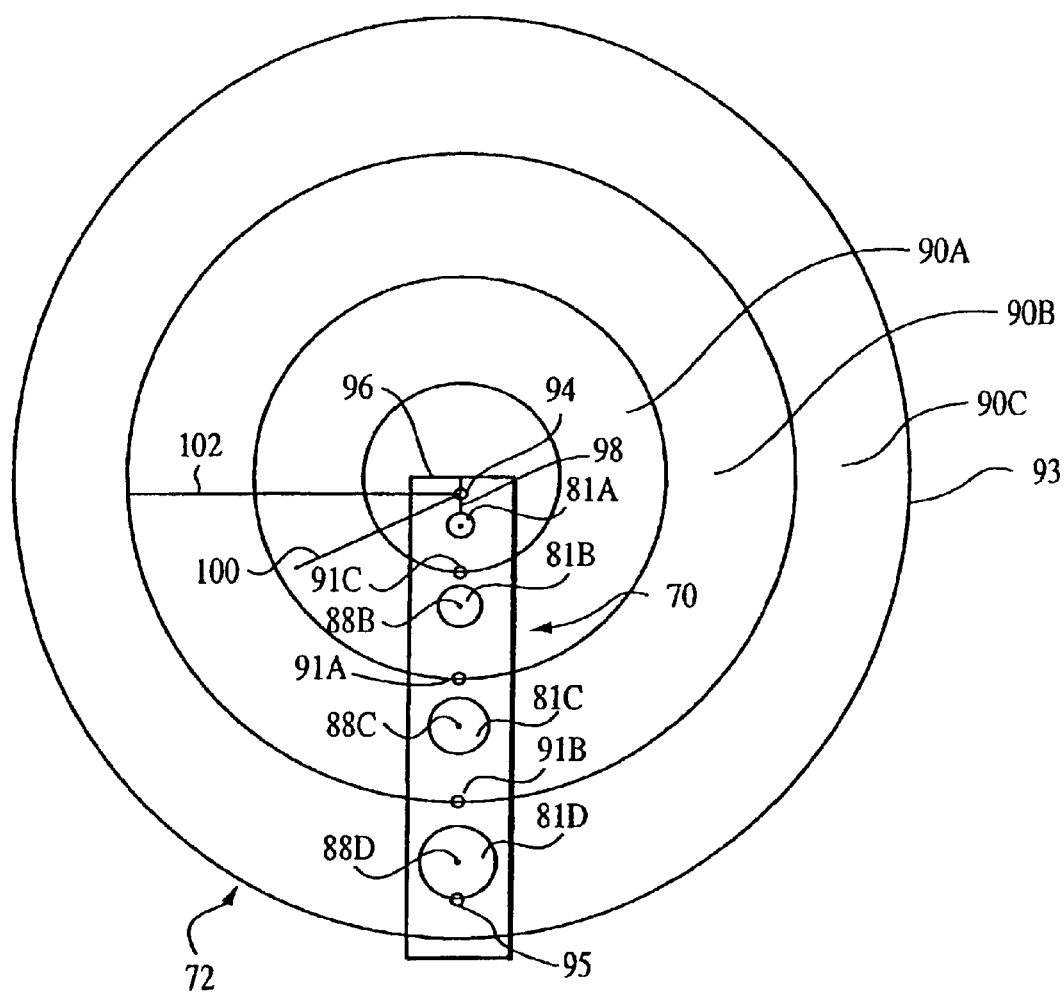
FIG. 14 is a bottom plan view of an alternative embodiment of the half-block nozzle showing concentric annuluses used for measuring fluid flow.

An alternative version of this embodiment of the half-block nozzle provides an even closer match between the amount of fluid dispensed onto the annular regions of the wafer and the area of those regions. The extent to which the desired uniform dispensing of fluid onto a wafer results can be measured by defining concentric annuluses using physical distances determined by the structure of the nozzle. FIG. 14 depicts the half-block nozzle 72 again, but this time with concentric annuluses 90A–C drawn. In this version, although depicted as circles with equidistant centers e.g. 88C,D, it will be appreciated by those of skill in the art that more generally, the orifices 81C are merely two-dimensional with a variety of possible non-circular shapes and have an approximate center, but may not have equidistant centers.

The center of the concentric annuluses is an end point 94. The end point is a point on the bottom surface lying anywhere between the center of the central orifice 81A and the linear intersection 96 of the bottom and the first side surface, preferably along a line 98 connecting the center of the central circle and the center of that linear intersection.

To assist in defining the concentric annuluses, the halfway points 91A, 91B between the centers of adjacent orifices, e.g. 88B, 88C, 88D are employed, whether or not those halfway points are points within, on, or outside the nozzle. To further assist the defining of the concentric annuluses, a flow circle with a perimeter 93 is defined by a center at the end point 94 and by a radius at least substantially equal in length to the distance from the end point to the furthest possible point 95 or points from the end point yet lying on an orifice (that orifice being called a perimeter orifice 81D). Except for the outermost concentric annulus or perimeter annulus 90C, the concentric annuluses are defined as annuluses within the flow circle, having centers at the end point and having inner 100 and outer 102 radiuses (one set of which is depicted), in the plane of the flow circle, defined as the distances, respectively, in length equal to the distances from the end point to two successive halfway points 91A, 91B. The outermost concentric annulus is defined in the same way except that its outer perimeter is not defined by an outer radius but by the perimeter 93 of the flow circle.

Finally, in the middle of, and within, the flow circle and inside the concentric annuluses is a central circle 104 corresponding to the central orifice 81A. The central circle is defined by a center at the end point 94 and a radius (not depicted), in the plane of the flow circle, in length equal to the distance from the end point to the halfway point 91C closest to the end point.

Each of the concentric annuluses corresponds to an orifice, the perimeter annulus 90C corresponding to the perimeter orifice 81D and the other concentric annuluses corresponding to the orifice between the two halfway points which define the radii of these other concentric annuluses. For example concentric annulus 90B corresponds to orifice 81C.

The measurement of uniform dispensing of fluid onto a wafer is accomplished by measuring the volume of fluid flow per unit time through each orifice and comparing that volume to the area of the corresponding concentric annulus, or, in the case of the central orifice, to the area of the central circle. The areas of the orifices can be selected by methods well known in the art to produce a volume of fluid flow per unit time dispensed through each orifice proportional to the area of the corresponding concentric annulus or corresponding central circle, all with the same proportionality constant. The areas of the orifices are one nozzle characteristic that can produce the proportional variation in, and affect, the volume of fluid flow just described. However, it will be apparent to those of ordinary skill in the art that other characteristics of the nozzle, including its nozzle tips and small passages, can produce pressure, viscosity and other physical effects with the same proportional variation.

A second embodiment of the invention, called the full block (even) nozzle, has the same perspective view, cross-sectional view along the longitudinal axis and transverse cross-sectional view as the half-block nozzle shown in FIGS. 10, 11 and 12. However, the nozzle tip and its orifices, even in number, are arranged on the nozzle in a row whose length is approximately the diameter of the wafer. One of the pairs of side surfaces depicted in FIG. 11 as 82A,B comprises a first side surface 1118B and a second side surface 118A.

Figure 15:
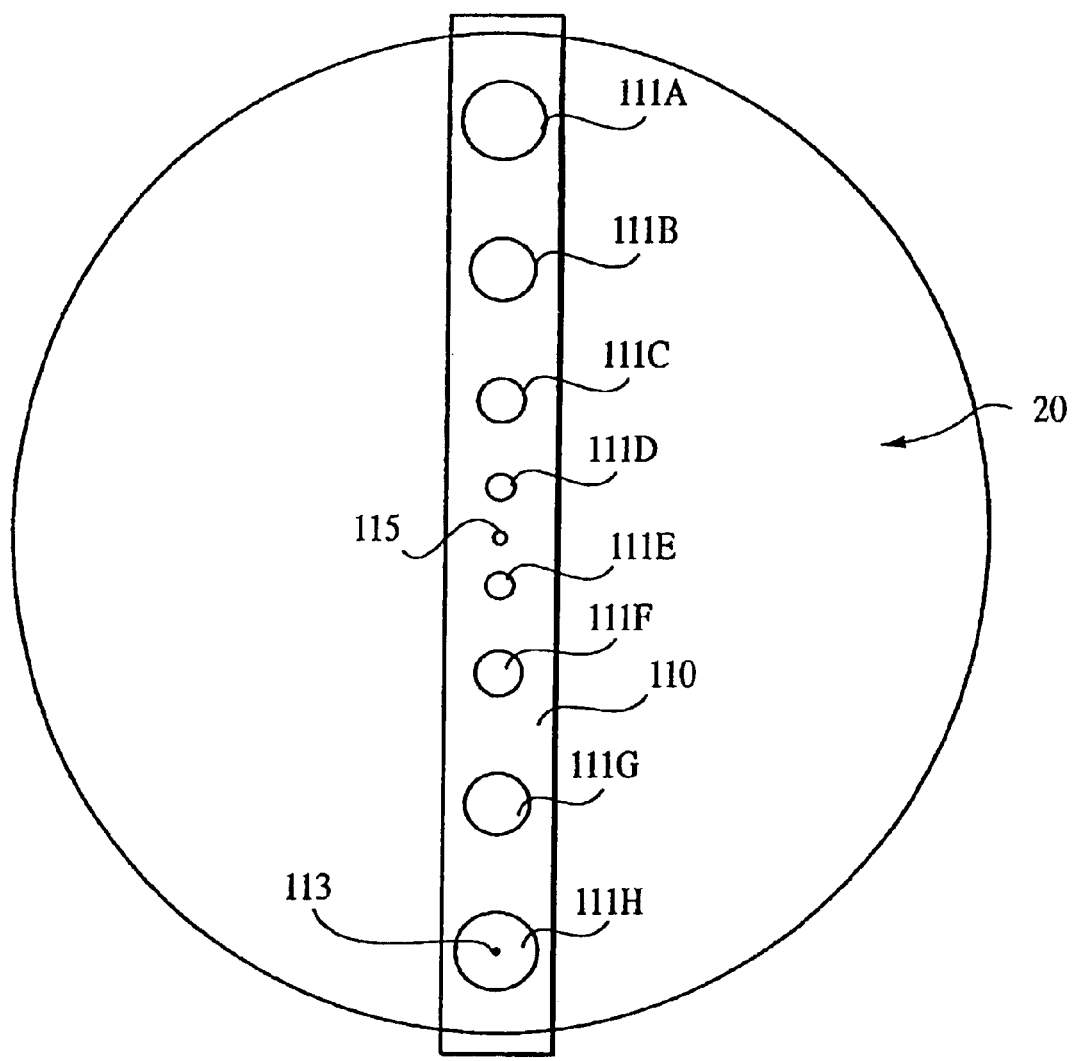
FIG. 15 is a bottom plan view of a second embodiment of the invention called the full-block (even) nozzle looking upwards from a wafer disposed below the full-block nozzle and showing its orifices.

FIG. 15, in bottom plan view looking upwards from a rotating wafer 20 below the nozzle, shows the full-block (even) nozzle 110 with its row of orifices 111A–H. In this view and this orientation of the nozzle with respect to the wafer, the orifices face the wafer sufficiently to allow fluid dispensed from the orifices to contact the wafer surface with minimal disturbance of the desired dispensing process. Although the orifices 111A–H are depicted in FIG. 15 as being generally co-planar, circular in shape and equidistant from each other in center-to-center distance, it will be apparent to those of ordinary skill in the art that the bottom may not be planar, the nozzle tip bottom ends in which the orifices are openings may not be co-planar, that the orifice centers 113 might not be equidistant from each other, and that the orifice shapes might not be planar or two-dimensional and, even if two-dimensional and planar, might be semi-circular, elliptical, square or hexagonal in shape or of some other shape altogether. The nozzle 110, when placed over the wafer 20, extends about one wafer diameter between opposite points on the perimeter of the wafer.

For measurement convenience, a middle point 115 is defined as the point halfway between the middle two members 111D, 111E of the row of orifices. This middle point may be a point within, on or outside the nozzle, depending upon the exact geometry of the bottom of the nozzle. The characteristics of the nozzle are selected so that the volume of fluid flow per unit time through a given orifice exceeds, or is at least substantially equal to, the volume of fluid flow per unit time through any other orifice closer to the middle point 115 than the given orifice. As depicted in FIG. 15, the diameters of the circular orifices increase along the row beginning with the middle point. The increasing orifice diameter is one nozzle characteristic that can produce the result of generally increasing, or non-decreasing, volume of fluid flow just described. However, it will be apparent to those of ordinary skill in the art that other characteristics of the nozzle, including its nozzle tips and small passages, can produce pressure, viscosity and other physical effects with the same result.

More particularly, this embodiment can be employed so that the middle point 115 lies approximately over the center of the wafer (not depicted). So utilized, this embodiment provides greater uniformity of dispensed fluid on the wafer than the prior art by providing greater amounts of fluid into annular regions of the wafer with greater area.

Figure 16:
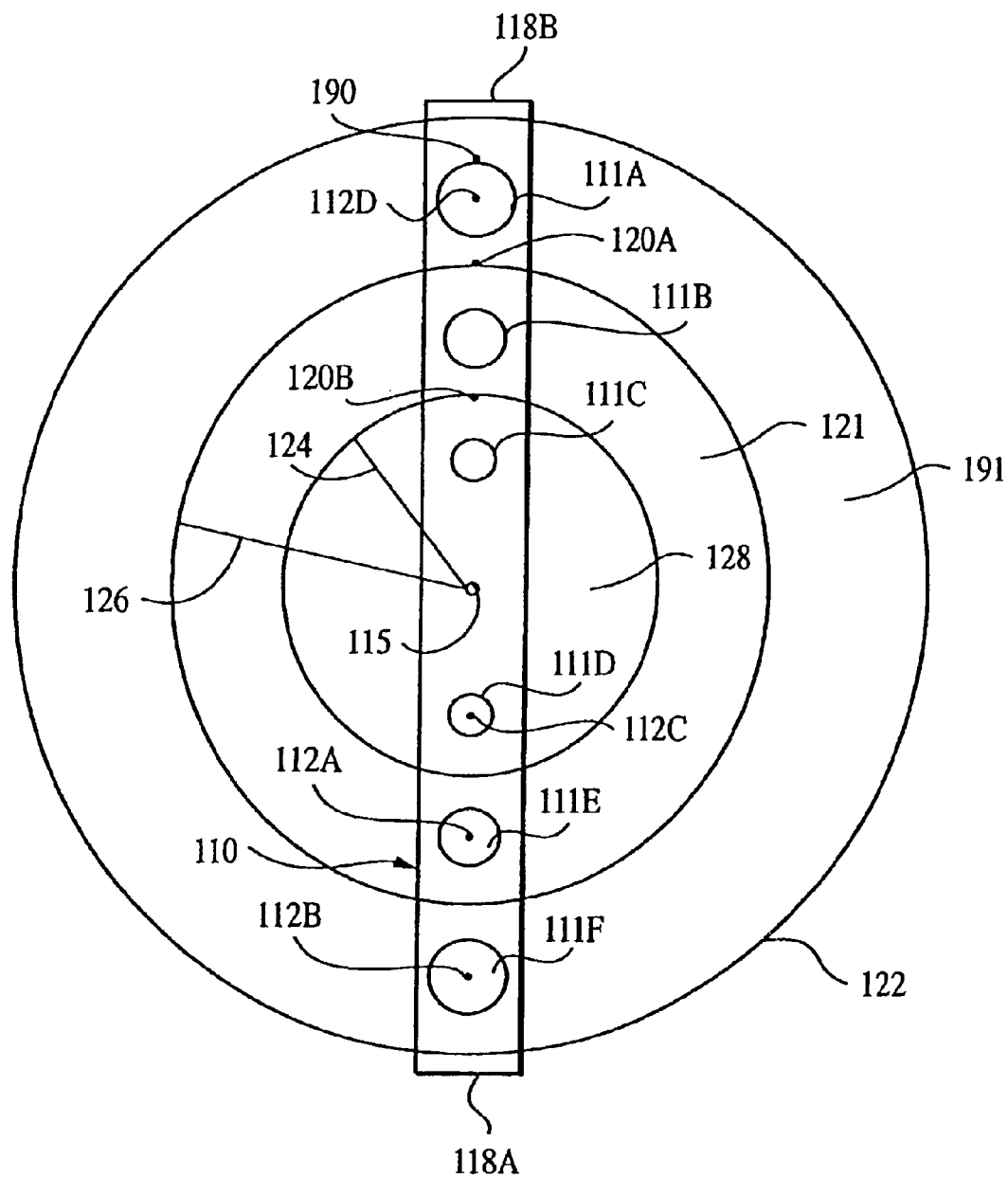
FIG. 16 is a bottom plan view of an alternative embodiment of the full-block (even) nozzle showing concentric annuluses used for measuring fluid flow.

An alternative version of this embodiment of the invention provides an even closer match between the amount of fluid dispensed onto the annular regions of the wafer and the area of those regions. The extent to which the desired uniform dispensing of fluid onto a wafer results can be measured by defining concentric annuluses using physical distances determined by the structure of the nozzle. FIG. 16 depicts the full-block (even) nozzle 110 again, but this time with concentric annuluses drawn. In this version, although depicted as circles with equidistant centers, e.g. 112A, 112B, 112C, it will be apparent to those of skill in the art that more generally the orifices 111A–F are merely two-dimensional with a variety of possible non-circular shapes and have an approximate center but may not have equidistant centers. The center of the concentric annuluses is the middle point.

One-half of the row of orifices 111A, 111B, 111C, a half on one side of the middle point 115, is referred to as the half row, and that side is the side closest to the first side surface 118B. The two perimeter orifices 111F, 111A comprise the two orifices furthest from the first side surface 118B and the second side surface 118A, respectively. The orifices are disposed in pairs, e.g. 111B and 111E, on opposite sides of the middle point 115 so that the center of each orifice in a pair, e.g. 112B, 112D is at a substantially equal distance from the middle point 115, each orifice in a pair being a partner of the other orifice in that pair.

To assist in defining the concentric annuluses, the halfway points 120A, 120B between the centers of adjacent orifices, e.g. 111A, 111B in the half row are employed, whether or not those halfway points are points within, on, or outside the nozzle. To further assist the defining of the concentric annuluses, a flow circle with a perimeter 122 is defined by a center at the middle point 115 and by a radius at least substantially equal in length to the distance from the middle point to one of the points the furthest 190 from the middle point lying on the perimeters of the perimeter orifices 111A, 111F. Except for the outermost concentric annulus or perimeter annulus 191, the concentric annuluses are defined as annuluses within the flow circle, having centers at the middle point and having inner and outer radiuses 124, 126, in the plane of the flow circle, defined as the distances, respectively, in length equal to the distances from the middle point to two successive halfway points 120B, 120A. The outermost concentric annulus is defined in the same way except that its outer perimeter is not defined by an outer radius but by the perimeter 122 of the flow circle.

Finally, in the middle of, and within, the flow circle and inside the concentric annuluses is a middle circle 128. The middle circle is defined by a center at the middle point 115 and a radius 124, in the plane of the flow circle, in length equal to the distance from the middle point to the halfway point 120B closest to the middle point.

Each of the concentric annuluses corresponds to an orifice, the perimeter annulus 191 corresponding to the perimeter orifice 111A in the half row and the other concentric annuluses corresponding to the orifice between the two halfway points which define the radii of these other concentric annuluses. For example concentric annulus 121 corresponds to orifice 111B.

The measurement of uniform dispensing of fluid onto a wafer is accomplished by measuring the volume of fluid flow per unit time through each orifice and its partner and comparing that volume to the area of the corresponding concentric annulus, or, in the case of the two orifices closest to the middle point, to the area of the middle circle. The areas of the orifices can be selected by methods well known in the art to produce a volume of fluid flow per unit time dispensed in the aggregate through each orifice (other than the two orifices closest to the middle point) and its partner proportional to the area of the corresponding concentric annulus, all with the same proportionality constant, and dispensed in the aggregate through the two orifices closest to the middle part proportional to the area of the middle circle with such proportionality constant. The areas of the orifices are one nozzle characteristic that can produce the proportional variation in, and affect, the volume of fluid flow just described. However, it will be apparent to those of ordinary skill in the art that other characteristics of the nozzle, including its nozzle tips and small passages, can produce pressure, viscosity and other physical effects with the same proportional variation.

A third embodiment of the invention, called the full block (odd) nozzle, has the same perspective view, cross-sectional view along the longitudinal axis and transverse cross-sectional view as the half-block nozzle shown in FIGS. 10, 11 and 12. However, the nozzle tip and its orifices, odd in number, are arranged on the nozzle in a row whose length is approximately the diameter of the wafer. One of the pairs of side surfaces depicted in FIG. 11 as 82A,B comprises a first side surface 139B and a second side surface 139A.

Figure 17:
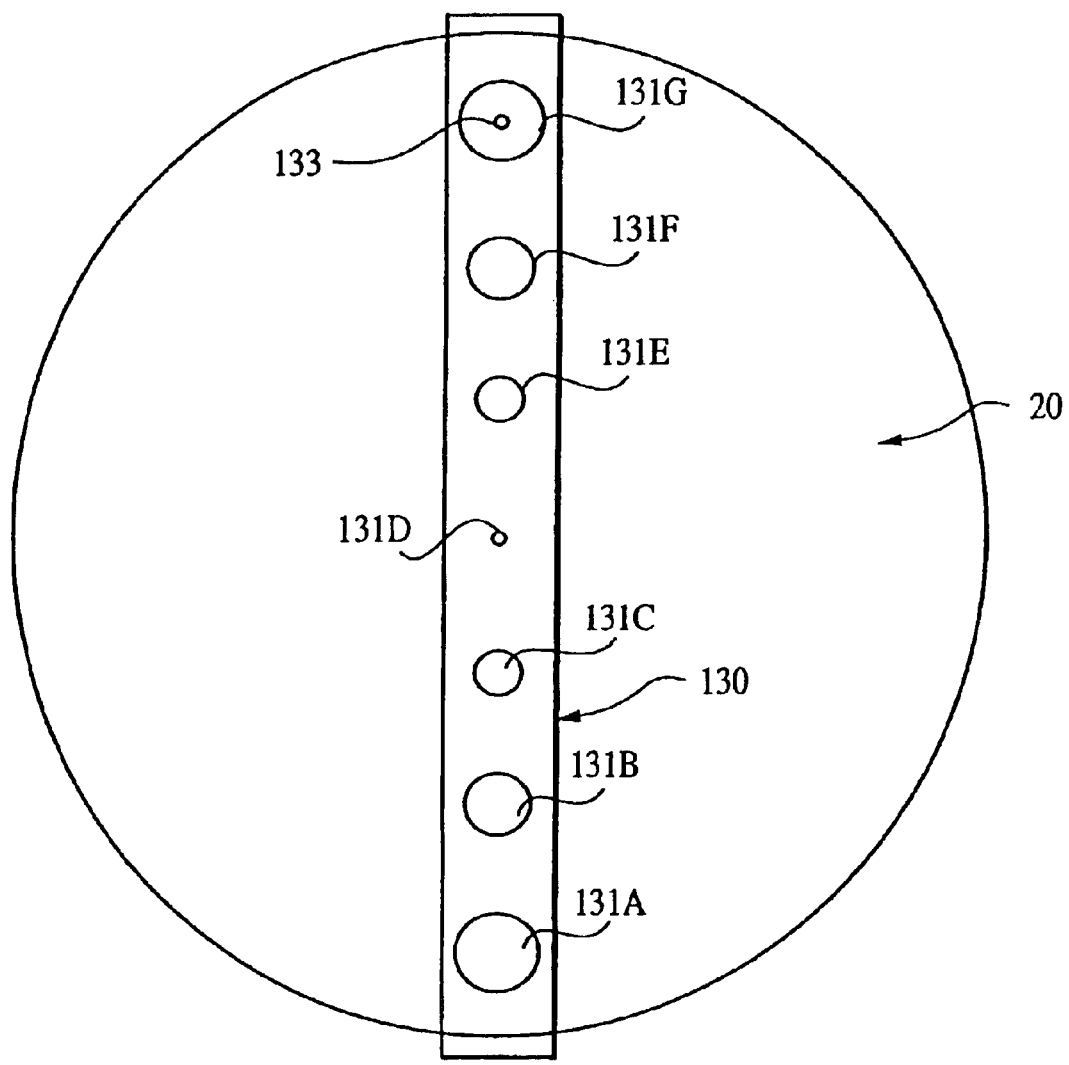
FIG. 17 is a bottom plan view of a third embodiment of the invention called the full-block (odd) nozzle looking upwards from a wafer disposed below the full-block nozzle and showing its orifices.

FIG. 17, in bottom plan view looking upwards from a rotating wafer below the nozzle, shows the full-block (odd) nozzle 130 with its row of orifices 131A–G. In this view and this orientation of the nozzle with respect to the wafer, the orifices face the wafer sufficiently to allow fluid dispensed from the orifices to contact the wafer surface with minimal disturbance of the desired dispensing process. Although the orifices 131A–G are depicted in FIG. 16 as being generally co-planar, circular in shape and equidistant from each other in center-to-center distance, it will be apparent to those of ordinary skill in the art that the bottom may not be planar, the nozzle tip bottom ends in which the orifices are openings may not be co-planar, that the orifice centers 133 might not be equidistant from each other, and that the orifice shapes might not be planar or two-dimensional and, even if two-dimensional and planar, might be semi-circular, elliptical, square or hexagonal in shape or of some other shape altogether. The nozzle 130, when placed over the wafer 20, extends about one wafer diameter between opposite points on the perimeter of the wafer.

For measurement convenience, a middle orifice 131D is defined as the middle member of the row of orifices. The characteristics of the nozzle are selected so that the volume of fluid flow per unit time through a given orifice exceeds, or is at least substantially equal to, the volume of fluid flow per unit time through any other orifice closer to the middle orifice 115 than the given orifice. As depicted in FIG. 17, the diameters of the circular orifices increase along the row beginning with the middle orifice. The increasing orifice diameter is one nozzle characteristic that can produce the result of generally increasing, or nondecreasing, volume of fluid flow just described. However, it will be apparent to those of ordinary skill in the art that other characteristics of the nozzle, including its nozzle tips and small passages, can produce pressure, viscosity and other physical effects with the same result.

More particularly, this embodiment can be employed so that the middle orifice 131D lies approximately over the center of the wafer (not depicted). So utilized, this embodiment provides greater uniformity of dispensed fluid on the wafer than the prior art by providing greater amounts of fluid into annular regions of the wafer with greater area.

Figure 18:
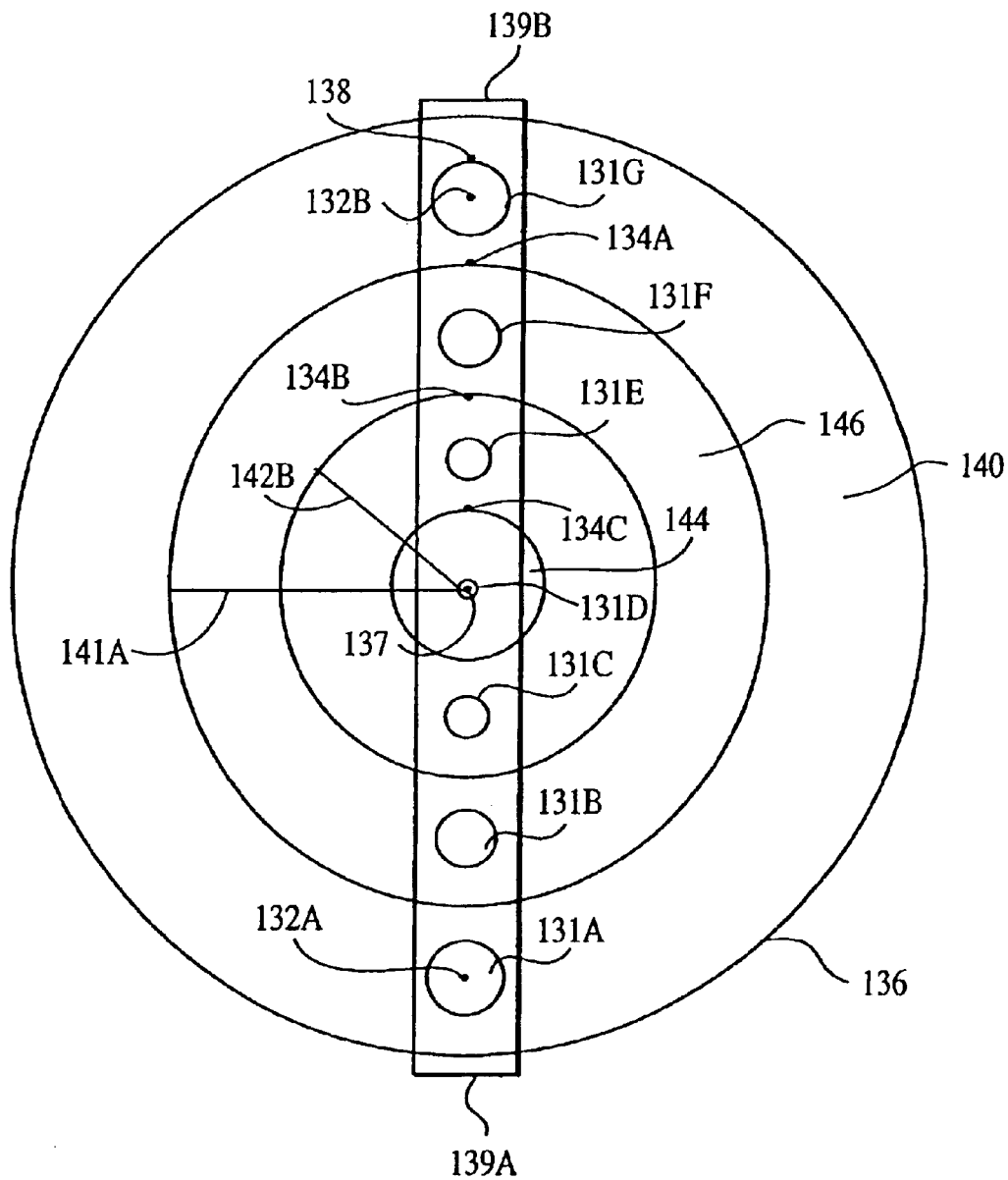
FIG. 18 is a bottom plan view of an alternative embodiment of the full-block (odd) nozzle showing concentric annuluses used for measuring fluid flow.

An alternative version of this embodiment of the invention provides an even closer match between the amount of fluid dispensed onto the annular regions of the wafer and the area of those regions. The extent to which the desired uniform dispensing of fluid onto a wafer results can be measured by defining concentric annuluses using physical distances determined by the structure of the nozzle. FIG. 18 depicts the full-block (odd) nozzle 130 again, but this time with concentric annuluses drawn. In this version, although depicted as circles with equidistant centers, e.g., 131G, 131F, 131E, it will be apparent to those of skill in the art that more generally the orifices 131A–G are merely two-dimensional with a variety of possible non-circular shapes and have an approximate center but may not have equidistant centers. The center of the concentric annuluses is the center 137 of middle orifice 131D.

The middle orifice 131D, together with one-half 131E, F, G of the row of other orifices, a half on one side of the middle orifice, is referred to as the half row, and that side is the side closest to the first side surface 139B. The two perimeter orifices 131A, 131G comprise the two orifices furthest from the first side surface 139B and the second side surface 139A, respectively. The orifices other than the middle orifice are disposed in pairs on opposite sides of the middle orifice 131D so that the center of each orifice in a pair, e.g., 132A, B is at a substantially equal distance from the center 137 of the middle orifice, each orifice in a pair being a partner of the other orifice in that pair.

To assist in defining the concentric annuluses, the halfway points, e.g., 134A, B between the centers of adjacent orifices in the half row are employed, whether or not those halfway points are points within, on, or outside the nozzle. To further assist the defining of the concentric annuluses, a flow circle with a perimeter 136 is defined by a center at the center 137 of the middle orifice and by a radius at least substantially equal in length to the distance from the center of the middle orifice to one of the points the furthest 138 from such center lying on the perimeters of the perimeter orifices 131G, 131A. Except for the outermost concentric annulus or perimeter annulus 140, the concentric annuluses are defined as annuluses within the flow circle, having centers at the center 137 of the middle orifice and having inner and outer radiuses, e.g., 142A, B, in the plane of the flow circle, defined as the distances, respectively, in length equal to the distances from the center of the middle orifice to two successive halfway points 134B, A. The outermost concentric annulus is defined in the same way except that its outer perimeter is not defined by an outer radius but by the perimeter 136 of the flow circle.

Finally, in the middle of, and within, the flow circle and inside the concentric annuluses is a middle circle 144. The middle circle is defined by a center at the center 137 of the middle orifice and a radius, in the plane of the flow circle, in length equal to the distance from the center of the middle orifice to the halfway point 134C closest to the middle orifice.

Each of the concentric annuluses corresponds to an orifice, the perimeter annulus 140 corresponding to the perimeter orifice 131G in the half row and the other concentric annuluses corresponding to the orifice between the two halfway points which define the radii of these other concentric annuluses. For example concentric annulus 146 corresponds to orifice 131F.

The measurement of uniform dispensing of fluid onto a wafer is accomplished by measuring the volume of fluid flow per unit time through each orifice and its partner and comparing that volume to the area of the corresponding concentric annulus, or, in the case of the middle orifice, to the area of the middle circle. The areas of the orifices can be selected by methods well known in the art to produce a volume of fluid flow per unit time dispensed in the aggregate through each orifice (other than the middle orifice) and its partner, proportional to the area of the corresponding concentric annulus, all with the same proportionality constant, and dispensed through the middle orifice proportional to the area of the middle circle with such proportionality constant. The areas of the orifices are one nozzle characteristic that can produce the proportional variation in, and affect, the volume of fluid flow just described. However, it will be apparent to those of ordinary skill in the art that other characteristics of the nozzle, including its nozzle tips and small passages, can produce pressure, viscosity and other physical effects with the same proportional variation.

Figure 19:
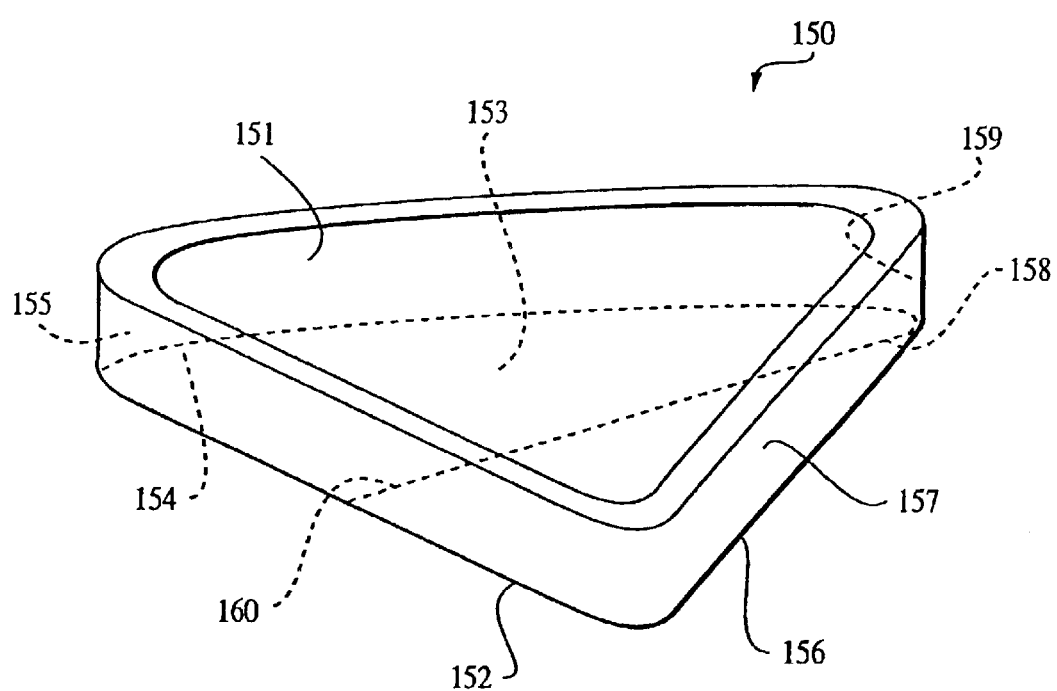
FIG. 19 is a perspective view of the fourth and preferred embodiment of the invention called a wedge nozzle.

FIG. 19 depicts a perspective view of a fourth and preferred embodiment of the invention known as a wedge nozzle 150. The nozzle is a generally wedge-shaped vessel with a total surface, a top surface 151, a bottom 153, a first side surface 155, a second side surface 157, and a very small middle side surface 159. The bottom has a perimeter edge 152, a first side edge 154, a second side edge 156 and a very small middle side edge 158. In a more preferable embodiment, the perimeter is arc-shaped and the small middle side edge 158 is substantially a point. Of course variations in this general shape will be readily apparent to those of ordinary skill in the art.

Figure 20:
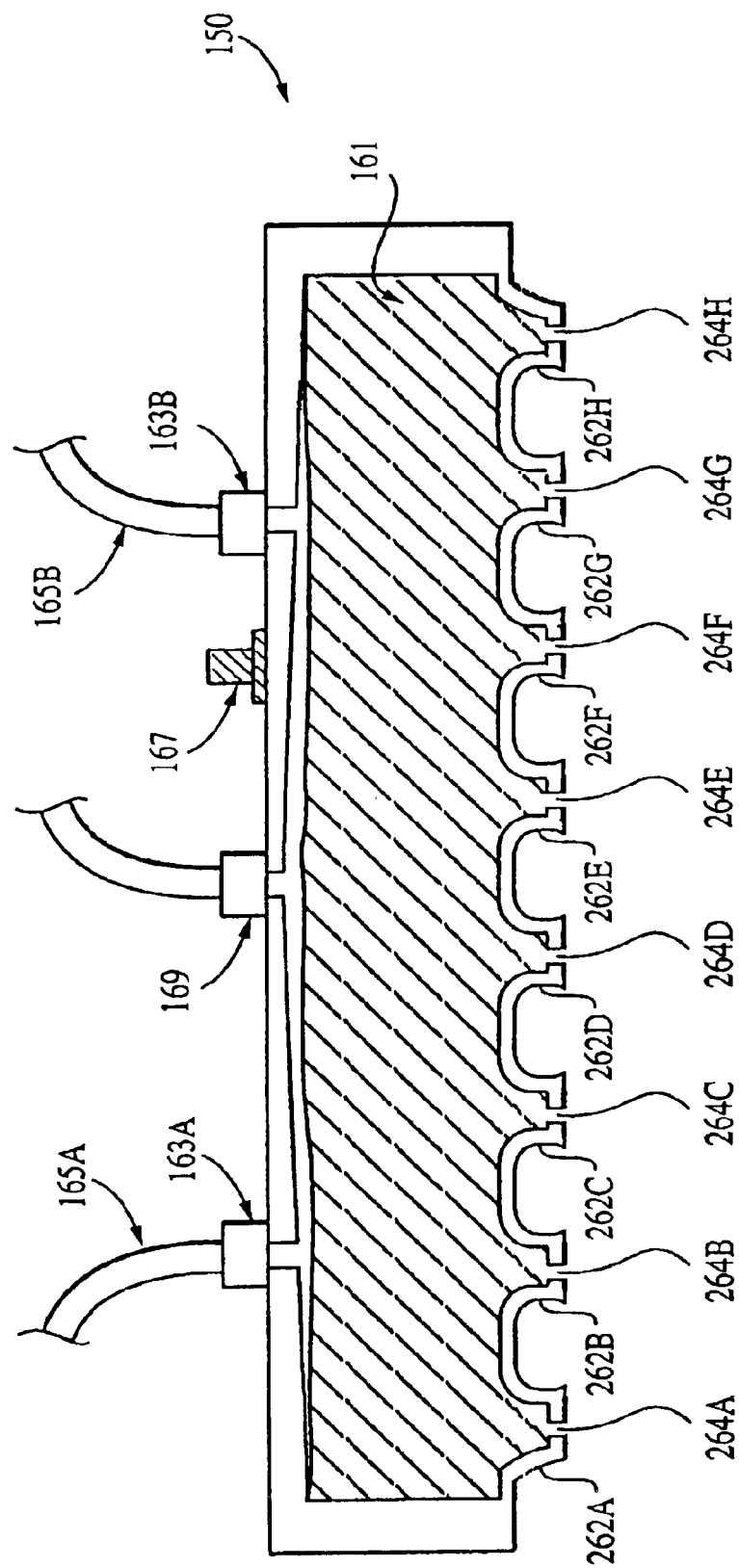
FIG. 20 is a cross-sectional view of the wedge nozzle along an axis connecting the middle side edge and a point on the perimeter edge.

FIG. 20 a depicts a cross-sectional view of the preferred embodiment along an axis 160 connecting the middle side edge 158 and a point on the perimeter edge 152 and perpendicular to the top surface 151 of this embodiment. This view shows the interior 161 serving as a liquid reservoir. The nozzle's top surface has one or more inlet fittings 163A, B for attachment to a fluid supply tube 165A, B, a support 167 for connection to an external apparatus (not depicted) to support the nozzle, and an outlet fitting 169 for attachment to a gas outlet tube. Nevertheless, it will be apparent to those of ordinary skill in the art that these items shown on the top surface may or may not be present in the numbers, or in the locations on the nozzle, or in fact may be entirely absent. The bottom of the nozzle has portions downwardly projecting called nozzle tips 262A, B, C, D, E, F, G, H with a multiplicity of openings or orifices 264A, B, C, D, E, F, G, H out of which the fluid is dispensed. With the exception of the nozzle tips, the bottom is generally planar. Again, it will be apparent to those of ordinary skill in the art that the orifices might be disposed on a bottom that has no nozzle tips.

Figure 21:
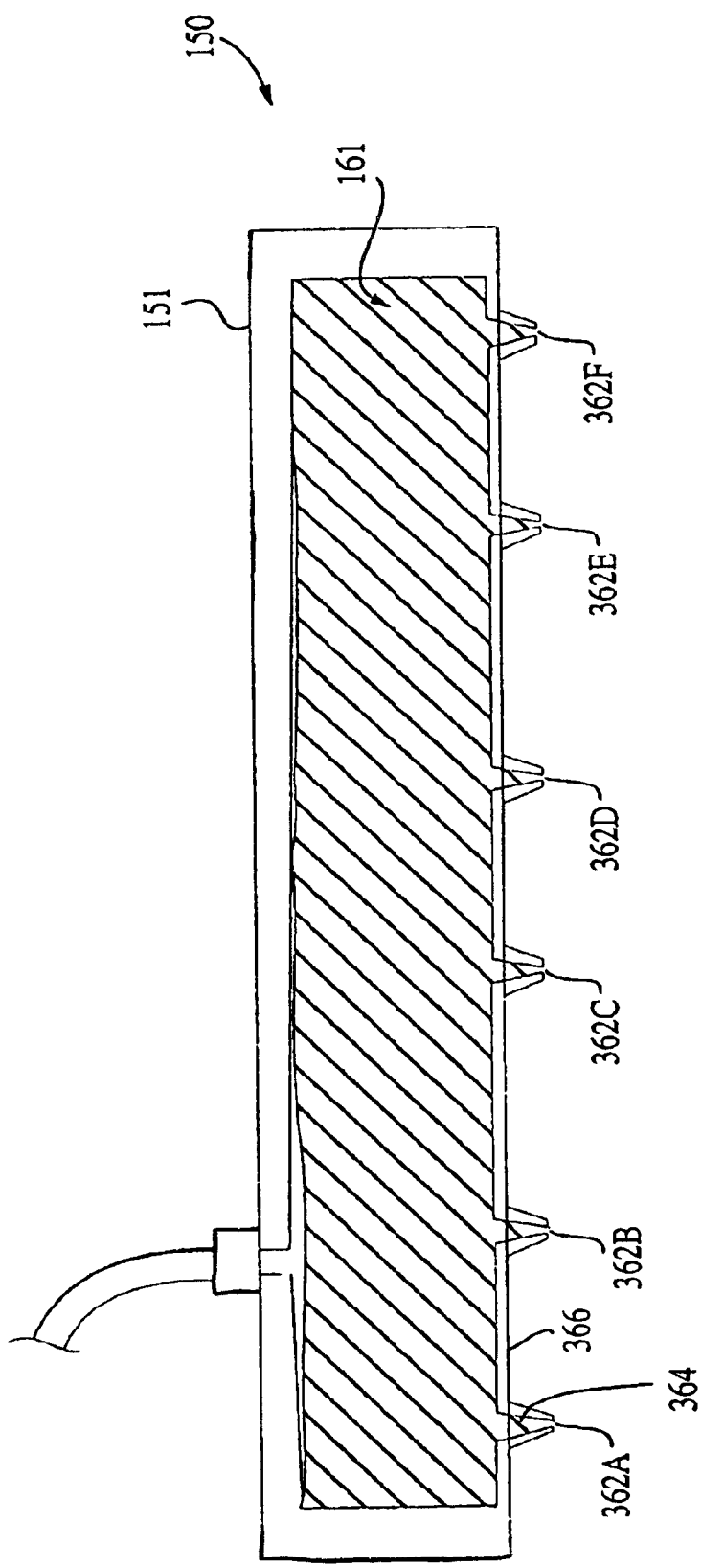
FIG. 21 is a transverse cross-section of the wedge nozzle.

FIG. 21 depicts a transverse cross-section of the wedge nozzle 150 perpendicular to the longitudinal axis 160 and to the top surface 151. The figure shows several orifices 362A–F, possibly in several different arcs (described below), in fluid communication with the vessel's interior 161 through slits, e.g., 364, in the nozzle tips and small passages, e.g., 366, in the bottom wall 368 of the interior.

Figure 22:
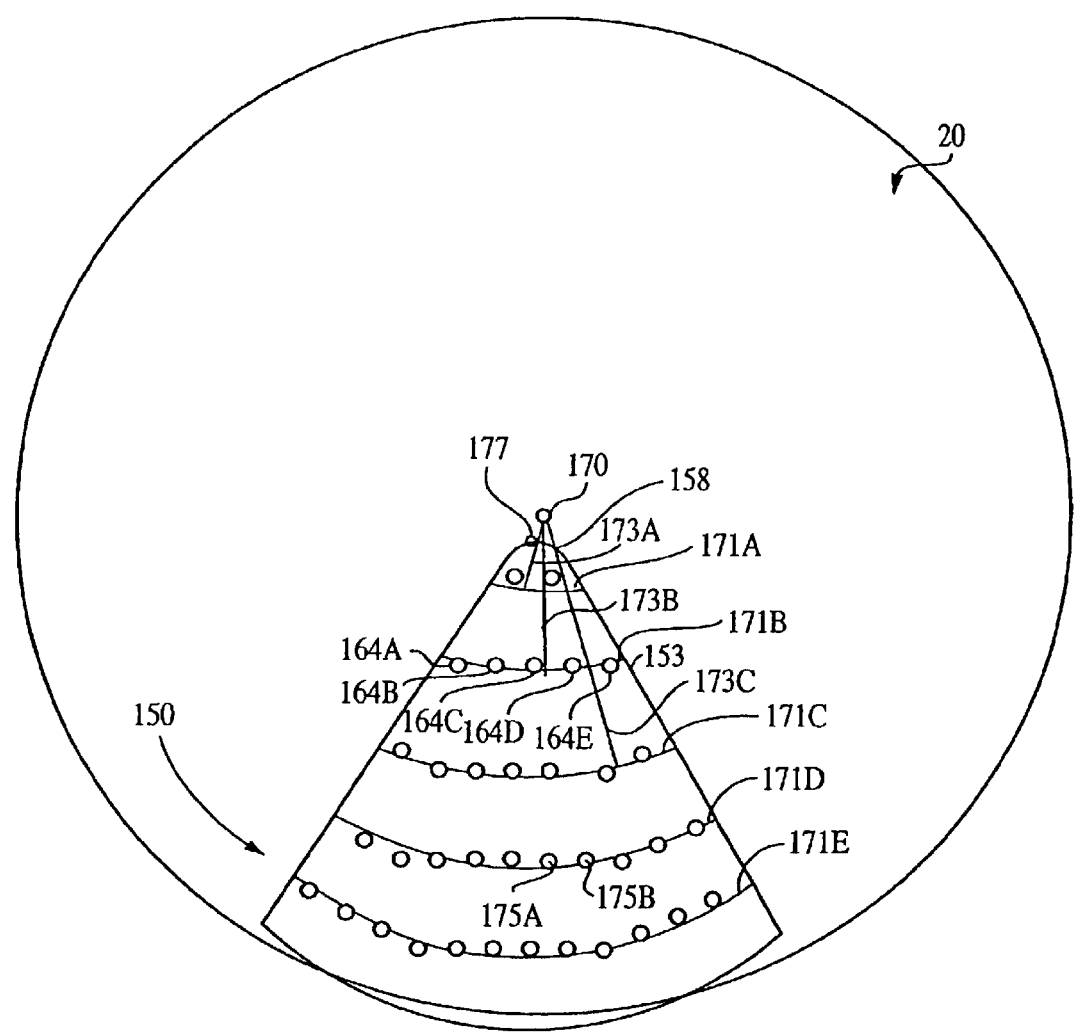
FIG. 22 is a bottom plan view of the wedge nozzle, looking upward from a wafer disposed below the wedge nozzle and showing its orifices.

FIG. 22, in bottom plan view looking upwards from a rotating wafer 20 below the nozzle, shows the wedge nozzle 150 with its arc-shaped rows of orifices, e.g, 164A–E. The bottom plan view depicts a reference point 170 situated on or in proximity to the bottom 153 and lying on a reference line (not shown) generally perpendicular to the bottom 153. A plurality of non-intersecting arcs 171A–E are shown, each with a center lying substantially on the reference line. For simplicity of depiction, the centers of the arc are shown at only one point on the reference line, the reference point 170. The arcs have a substantially circular shape and are defined by an arc radius, e.g., 173A–C. The orifices and their nozzle tips(not shown in FIG. 22) are depicted as disposed substantially along the arcs and it is implicit in the figure that the nozzle tips themselves also have this arc-like contour, with each orifice on a specific arc regarded as corresponding to that specific arc. Nevertheless, it will be apparent to one of skill in the art that the orifices and their nozzle tips can be disposed along only one or a small number of arcs or, for that matter, in patterns other than along arcs. In fact, it is apparent to one of skill in the art that there could be an individual nozzle tip for each orifice.

In this bottom plan view and this orientation of the nozzle with respect to the wafer, the orifices face the wafer sufficiently to allow fluid dispensed from the orifices to contact the wafer surface with minimal disturbance of the desired dispensing process. Although the orifices, e.g., 164A–E, are depicted in FIG. 22 as being generally co-planar, circular in shape with equal diameters (and are so in the most preferable embodiment), and equidistant from each other in center-to-center distance along a given arc, it will be appreciated by those of ordinary skill in the art that the bottom may not be planar, the nozzle tip bottom ends in which the orifices are openings may not be co-planar, that the orifice centers, e.g., 175A, 175B, might not be equidistant from each other, and that the orifice shapes might not be planar or two-dimensional and, even if two-dimensional and planar, might be semi-circular, elliptical, square or hexagonal in shape or of some other shape altogether. The wedge nozzle, when its small middle side edge 158 is placed over the wafer's center 177, covers an approximately arc-shaped segment of the wafer.

The characteristics of the nozzle are selected so that the aggregate volume of fluid flow per unit time through the orifices corresponding to one arc, e.g., 171C, defined by its arc radius is greater than or substantially equal to such fluid flow through the orifices corresponding to another arc, e.g., 171B, with a smaller arc radius. As depicted in FIG. 22, the numbers of the orifices increase along the rows beginning with the row 171A closest to the reference point 170. The increasing orifice numbers, and corresponding increase in aggregate area of the orifices along the rows, are one nozzle characteristic that can produce the result of generally increasing, or non-decreasing, volume of fluid flow just described and that can affect that volume of fluid flow. However, it will be apparent to those of ordinary skill in the art that other characteristics of the nozzle, including its nozzle tips and small passages, can produce pressure, viscosity and other physical effects with the same result.

More particularly, this embodiment can be employed so that the small middle edge 158 is placed over the center 177 of the wafer. So utilized, the wedge nozzle provides greater uniformity of dispensed fluid on the wafer than the prior art by providing greater amounts of fluid into annular regions of the wafer with greater area.

A more preferable embodiment of the wedge nozzle provides an even closer match between the amount of fluid dispensed onto the annular regions of the wafer and the area of those regions. The extent to which the desired uniform dispensing of fluid onto a wafer results can be measured by defining concentric annuluses lying within a circle using physical distances determined by the structure of the nozzle. This embodiment applies only when there are two or more arcs. The description that will be provided applies to the case when there are three or more arcs. The modification of this discussion for application to nozzles with two arcs will be apparent to one of skill in the art, but will nonetheless be briefly discussed below.

Figure 23:
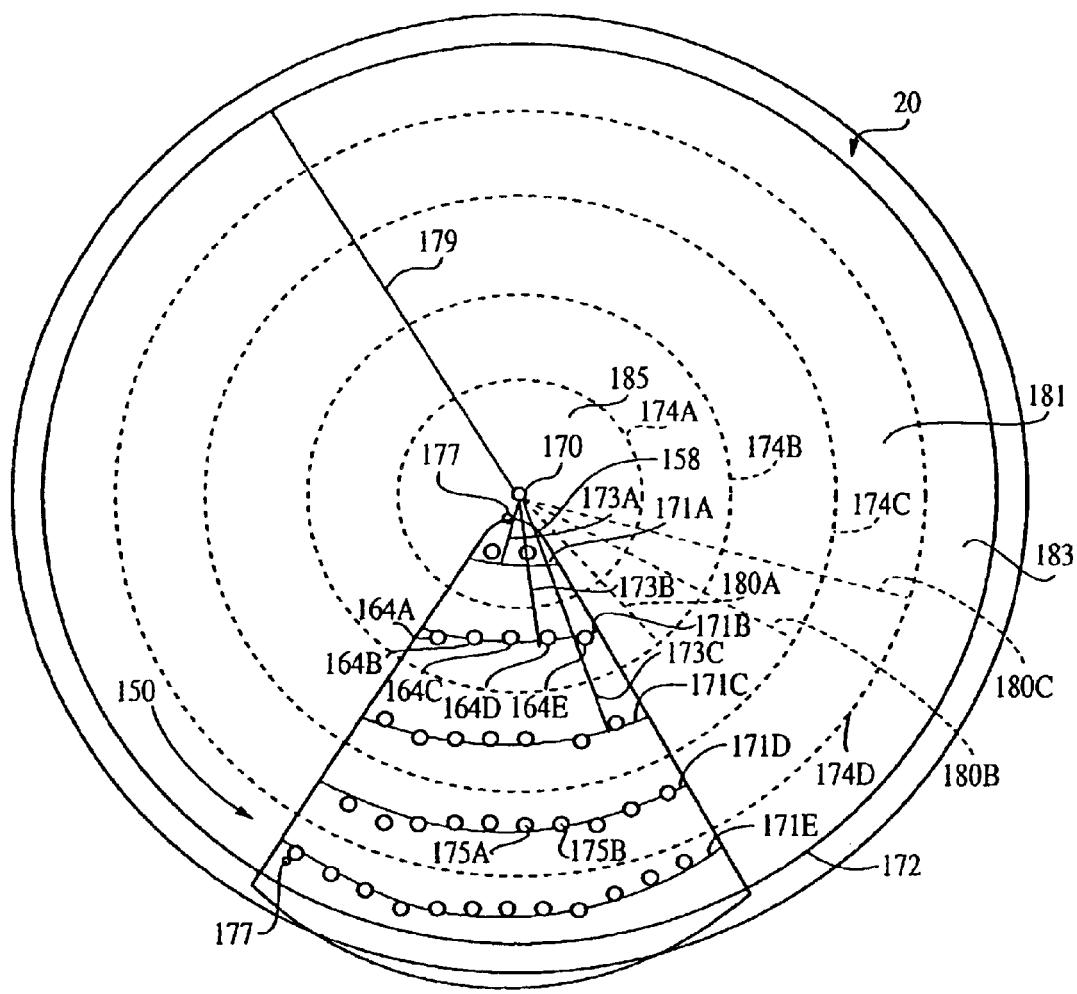
FIG. 23 is a bottom plan view of an alternative view of the wedge nozzle and more preferable embodiment of the invention showing concentric annuluses used for measuring fluid flow.

FIG. 23 depicts the wedge nozzle 150 again in a fashion similar to FIG. 22, but this time with concentric annuluses formed by halfway circles drawn with dashed lines. In this embodiment, although depicted as circles with equidistant centers, e.g., 175A, 175B, along a given arc, it will be apparent to those of skill in the art that in a less preferable embodiment the orifices, e.g., 164A–E, can be merely two-dimensional with a variety of possible non-circular shapes, but with an approximate center, and along a given arc may not have equidistant centers. In addition, in the more preferable embodiment, the perimeter edge is arc-shaped, the middle side edge is substantially a point and the reference point is situated at or in proximity to the middle side edge.

To assist in defining the concentric annuluses, several geometric concepts are defined: a perimeter curve 171E as the arc having the longest arc radius, and a central curve 171A as the arc closest to the reference point 170. In addition, a flow circle radius 179 is defined as the distance greater than or substantially equal to the distance from the reference point 170 to one of the points 177 furthest from the reference point of all of the points on the orifices corresponding to the perimeter curve 171E. With that definition, a flow circle 172 is defined by a radius equal to the flow circle radius and a center at the reference point.

Several additional geometric concepts are defined as well. Two arcs, e.g., 171A, B, are said to be adjacent when they are defined respectively by two arc radiuses 173A,B of successively greater length. An arc triplet comprises three arcs, e.g., 171A,B,C, defined respectively by three arc radiuses 173A,B,C of successively greater length. The inside arcs of the arcs of the arc triplet are the two arcs 171A,B of the arc triplet with the smallest two arc radiuses, while the outside arcs of the arc triplet are the two arcs 171B,C with the largest two arc radiuses. The middle arc of the arc triplet is the arc 171B with the arc radius of length between the lengths of the other two arc radiuses in the arc triplet. Finally, a halfway circle, e.g., 174B, is defined as a substantially circular shape within the flow circle having a radius 180A substantially halfway in length between the lengths of two arc radiuses 173B,C, defining any adjacent arcs, e.g., 171B,C.

Now the defining characteristics of the concentric annuluses can be laid out. An inner annular perimeter 174B comprises that halfway circle 174B of any two adjacent halfway circles, e.g. 174B,C, which is closer to the reference point 170. The inner annular perimeter 174B is said to correspond to that arc 171C which is the middle arc of that arc triplet 171B,C,D whose two inside arcs 171B,C define that closer halfway circle 174B. Conversely, an outer annular perimeter 174C comprises that halfway circle 174C of any two adjacent halfway circles, e.g., 174B,C, which is further from the reference point. The outer annular perimeter 174C corresponding to that arc 171C which is the middle arc of that triplet 171B,C,D whose two outside arcs 171C,D define that further halfway circle 174C. However, at the periphery, the inner final perimeter 174D is the halfway circle furthest from the reference point, while the outer final perimeter 172 is the perimeter of the flow circle.

At this point the concentric annuluses themselves can be described. An interior annulus, e.g., 181, is an annulus within the flow circle defined by an inner annular perimeter., e.g., 174B, corresponding to an arc 171C, and the outer annular perimeter 174C, corresponding to that arc. The interior annulus, e.g., 181 is deemed to correspond to that arc 171C. On the other hand, the perimeter annulus 183 is an annulus within the flow circle 172 defined by the inner final perimeter 174D and the outer final perimeter 172. The perimeter annulus is deemed to correspond to the perimeter curve 171E.

Putting together these two groups of annuluses, the concentric annuluses corresponding to an arc are defined as the perimeter annulus 183 corresponding to the perimeter curve (which is also an arc) and any interior annulus, e.g., 181, corresponding to any arc, e.g., 171C, other than the perimeter curve 171E. Together with the concentric annuluses, a central circle 185 is employed for. measurement. That circle lies within the flow circle and is defined by a perimeter identical to the halfway circle 174A closest to the reference point 120 and by a center at the reference point. This central circle is employed in connection with the central curve 171A.

The measurement of uniform dispensing of fluid onto a wafer is accomplished by measuring the combined volume of fluid flow per unit time through the orifices on an arc, e.g., 171C, and comparing that volume to the area of the concentric annulus, e.g., 181, corresponding to that arc (for all arcs other than the central curve), or, in the case of that arc 171A which is the central curve, to the area of the central circle 185. The areas of the orifices can be selected by methods well known in the art to produce a combined volume of fluid flow per unit time dispensed through each orifice on an arc (other than the central curve) proportional to the area of the corresponding concentric annulus or dispensed through each orifice on the central curve proportional to the area of the corresponding central circle, all with the same proportionality constant. For example, if the orifices on the nozzle are all of equal area, the number of orifices on each arc will be selected to produce the required proportional volume of fluid flow.

As mentioned above, the more preferable embodiment has been described for cases in which there are three or more arcs. By modifying the description in one major respect, the description would apply to the case of two arcs. This modification consists in eliminating the notion of the interior annulus. The measurements of fluid flow are then undertaken only for the perimeter annulus and the central circle. The areas and numbers of the orifices on each of the two arcs are then selected to produce the same proportionality achieved in the case where there are at least three arcs.

The areas or numbers of the orifices are one nozzle characteristic that can produce the proportional variation in, and affect the, volume of fluid flow just described. However, it will be apparent to those of ordinary skill in the art that other characteristics of the nozzle, including its nozzle tips and small passages, can produce pressure, viscosity and other physical effects with the same proportional variation.

Figure 24:
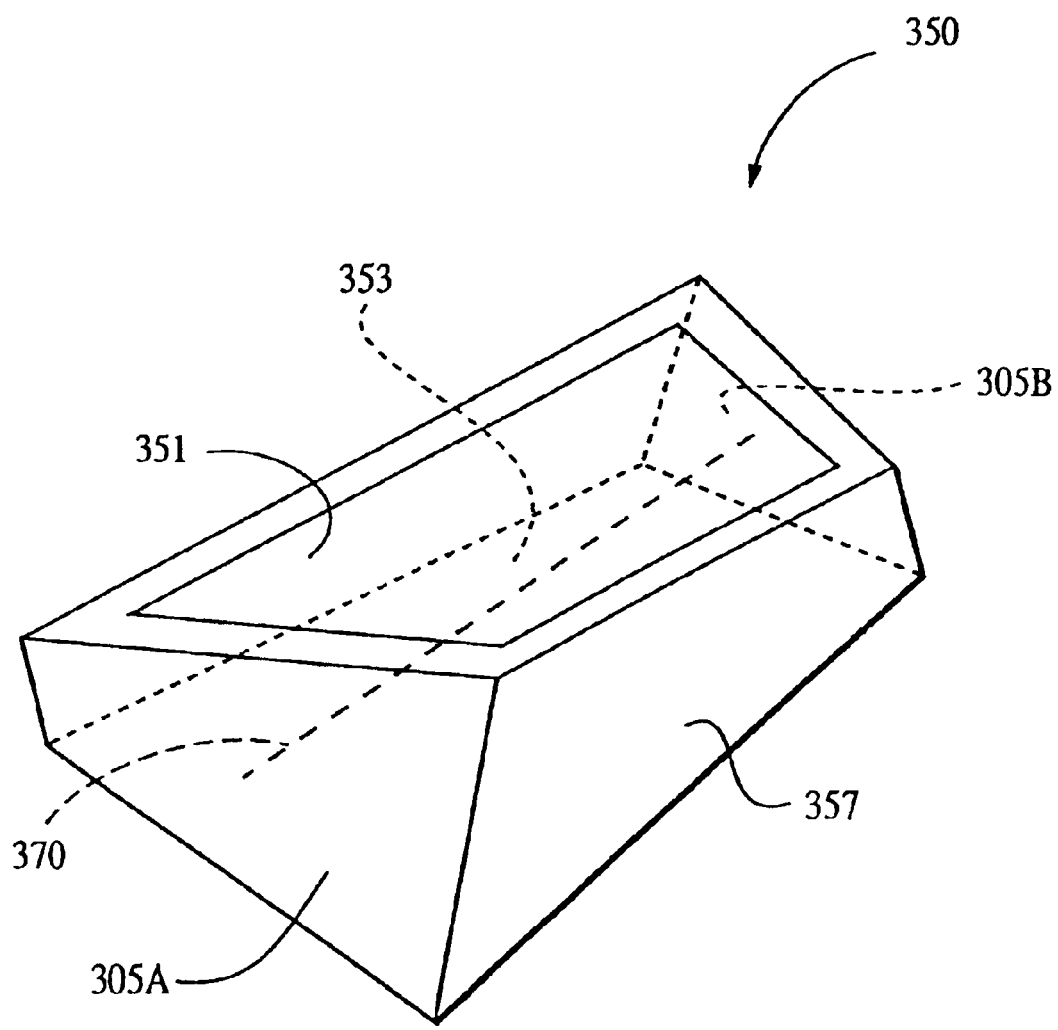
FIG. 24 is a perspective view of the fifth embodiment of the invention called a general-purpose (full) nozzle.

FIG. 24 depicts a perspective view of a fifth embodiment of the invention known as a general-purpose (full) nozzle 350. This embodiment is a vessel with a longitudinal axis 370, a total surface, a top surface 351, a bottom 353, a first side surface 305A, and a second side surface 305B. FIG. 24 depicts the intersections of various surfaces as linear. Other contours for those intersections and other variations in the general shape depicted will be readily apparent to those of ordinary skill in the art.

Figure 25:
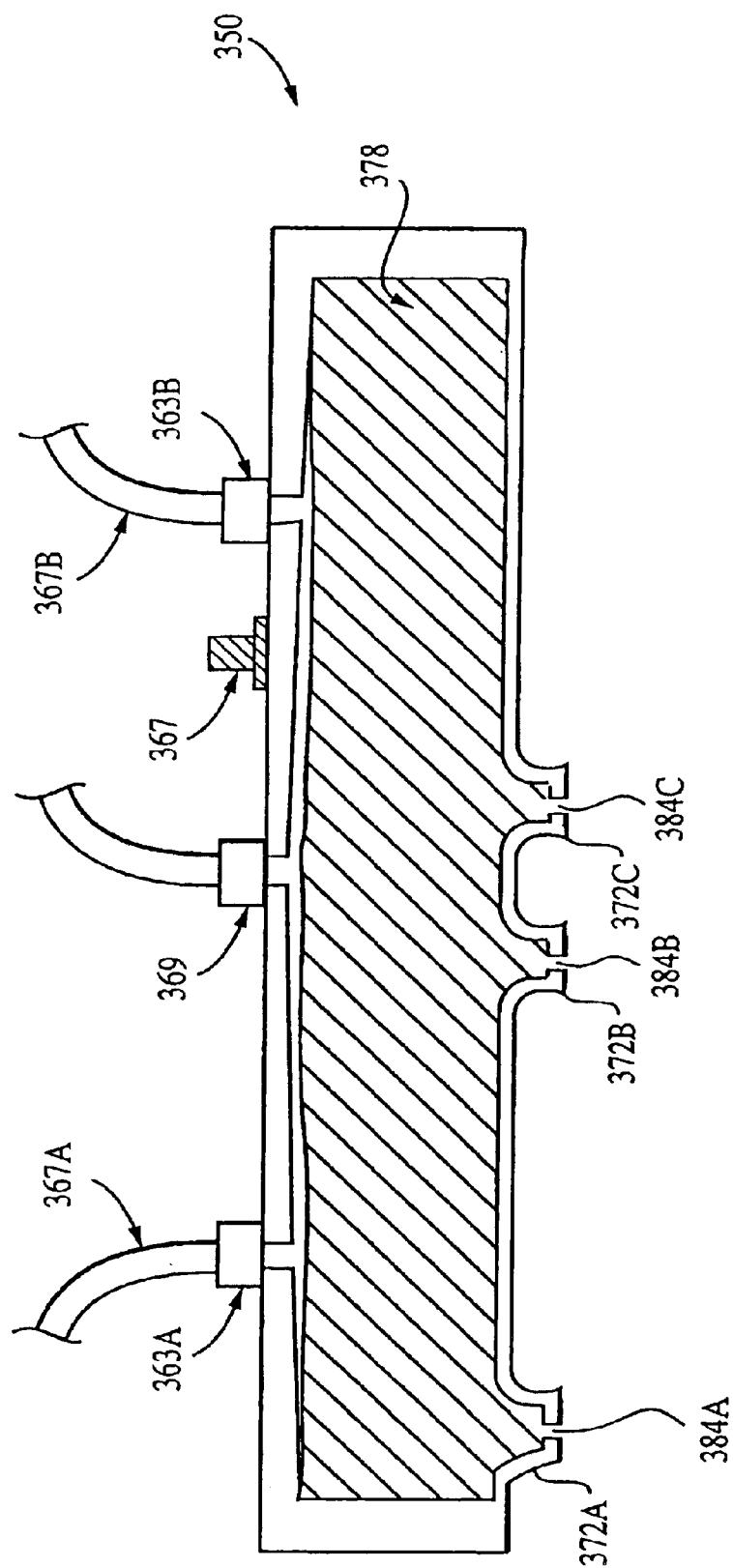
FIG. 25 is a cross-sectional view of the general-purpose (full) nozzle.

FIG. 25 depicts a cross-sectional view along the longitudinal axis 370 and perpendicular to the top surface 351 of this embodiment of the invention showing the interior 378 serving as a liquid reservoir. The general-purpose (full) nozzle's top surface 351 has one or more inlet fittings 363A, B for attachment to a fluid supply tube 367A, B, a support 367 for connection to an external apparatus (not depicted) to support the nozzle, and an outlet fitting 369 for attachment to a gas outlet tube. Nevertheless, it will be apparent to those of ordinary skill in the art that these items shown on the top surface may or may not be present in the numbers, or in the locations on the nozzle, or in fact may be entirely absent. The bottom of the nozzle has portions downwardly projecting called nozzle tips 372A, B, C with a multiplicity of openings or orifices 384A, B, C out of which the fluid is dispensed. Again, it will be apparent to those of ordinary skill in the art that the orifices might be disposed on a bottom that has no nozzle tip.

Figure 26:
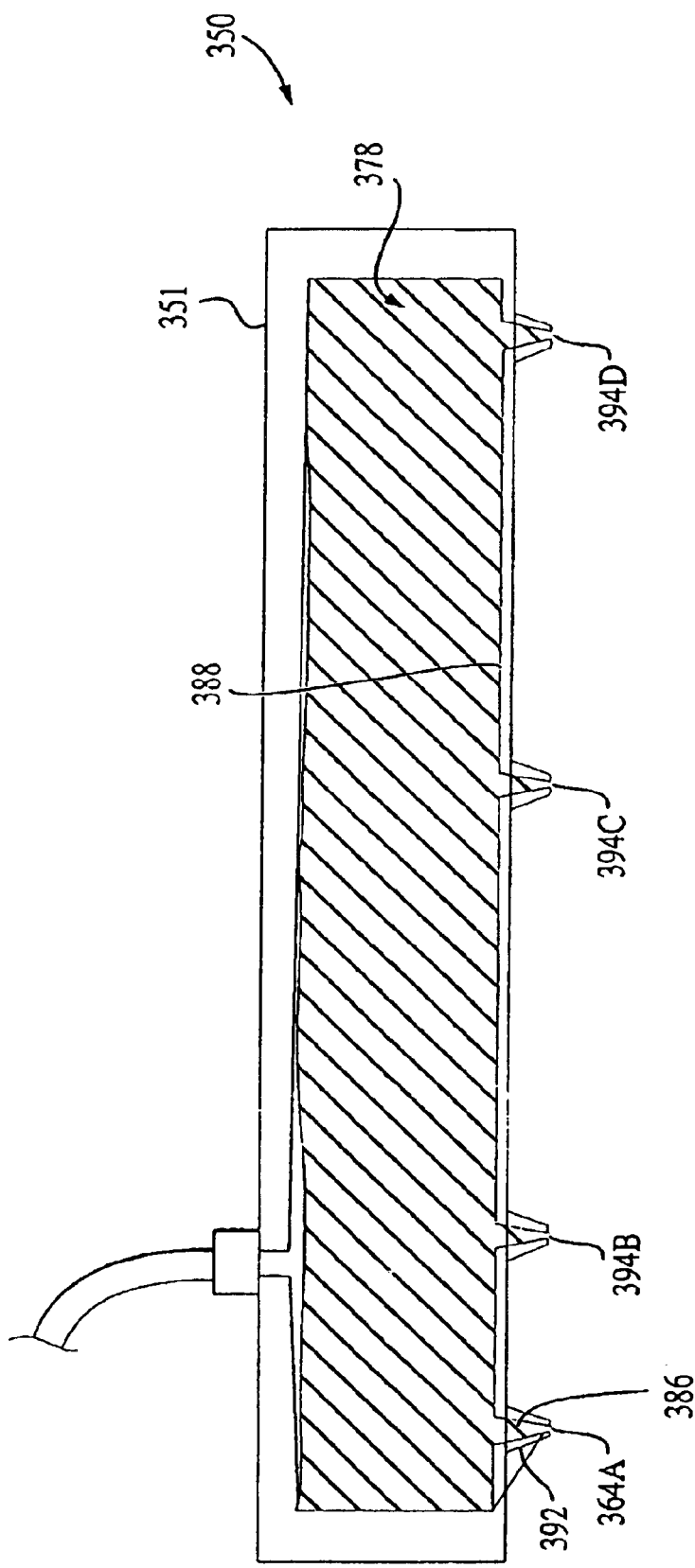
FIG. 26 is a transverse cross-section of the general-purpose (full) nozzle.

FIG. 26 depicts a transverse cross-section of the general-purpose (full) nozzle 350 perpendicular to the longitudinal axis 370 and to the top surface 351 of this embodiment. The figure shows several orifices 394A, B, C, D in fluid communication with the vessel's interior 378 through slits, e.g., 392, in the nozzle tips and small passages, e.g., 386 in the bottom wall 388 of the interior.

Figure 27:
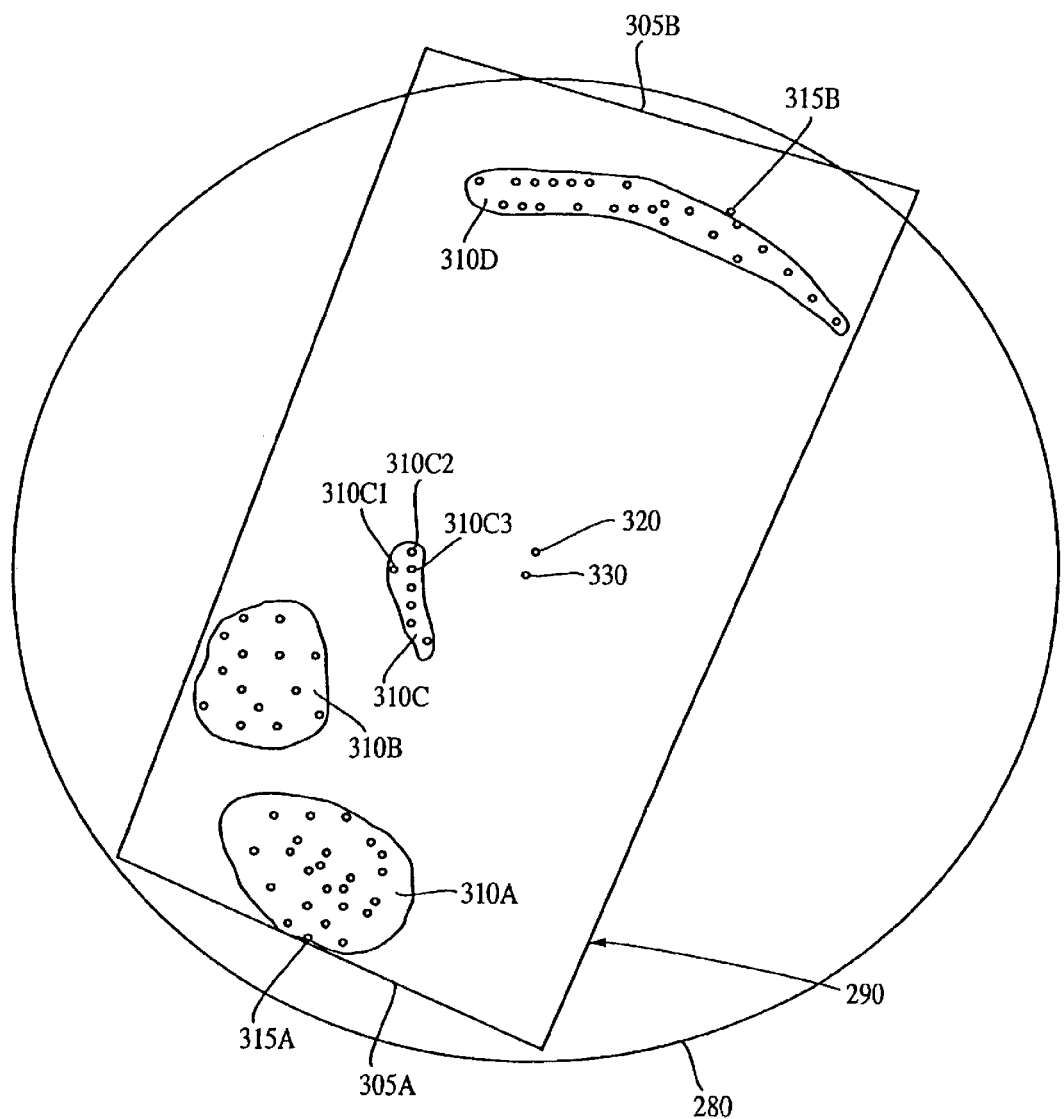
FIG. 27 is a bottom plan view of the general-purpose (full) nozzle, looking upward from a wafer disposed below the general-purpose (full) nozzle and showing its orifices.

FIG. 27, in bottom plan view looking upwards from a rotating wafer 280 below the nozzle 290, shows the general-purpose (full) nozzle 290 and orifices, e.g., 310C1, 310C2, 310C3. In this view and this orientation of the nozzle with respect to the wafer, the orifices face the wafer sufficiently to allow fluid dispensed from the orifices to contact the wafer surface with minimal disturbance of the desired dispensing process. Although the orifices, e.g., 310C1, 310C2, 310C3, are depicted in FIG. 27 as being generally co-planar and circular in shape, it will be apparent to those of ordinary skill in the art that the bottom may not be planar and the nozzle tip bottom ends in which the orifices are openings may not be co-planar and that the orifice shapes might not be planar or two-dimensional and, even if two-dimensional and planar, might be semi-circular, elliptical, square or hexagonal in shape or of some other shape altogether. The nozzle 290, when placed over the wafer 280, extends about one wafer diameter between opposite points on the perimeter of the wafer 280.

For measurement convenience, several geometrical features of the bottom are defined. The bottom is subdivided into two or more non-overlapping portions called bottom subregions 310A,B,C,D. One of these is called the first perimeter subregion 310A which is one of the one or more bottom subregions closest to the first side surface 305A, while the second perimeter subregion 310D is one of the one or more bottom subregions closest to the second side surface 305B. Each orifice is wholly contained within one of the bottom subregions and each bottom subregion contains at least one orifice.

In addition to bottom subregions, special points are isolated. The first perimeter point 315A is one of the one or more points on the first perimeter subregion closest to the first side surface 305A, while the second perimeter point 315B is one of the one or more points on the second perimeter subregion closest to the second side surface 305B. The halfway point 320 is a point substantially halfway between the first perimeter point and the second perimeter point, while the middle point 330 is one of the one or more points on the bottom closest to the halfway point. This halfway point may be a point within, on or outside the nozzle 290, depending upon the exact geometry of the bottom of the nozzle while the middle point is on the nozzle bottom.

The characteristics of the nozzle are selected so that the aggregate volume of fluid flow per unit time through all the orifices in a given bottom subregion, e.g., 310B, are greater than or substantially equal to such flow through all the orifices in any other bottom subregion, e.g., 310C, closer to the middle point 330 than the given bottom subregion. As depicted in FIG. 27, the numbers of the circular orifices are generally larger in bottom subregions further from the middle point. This increasing number of orifices is one nozzle characteristic that can produce the result of generally increasing, or non-decreasing, volume of fluid flow just described. However, it will be apparent to those of ordinary skill in the art that other characteristics of the nozzle, including its nozzle tips and small passages as well as the diameters of the orifices, can produce pressure, viscosity and other physical effects with the same result.

More particularly, this embodiment can be employed so that the middle point 330 lies approximately over the center of the wafer (not depicted). So utilized, this embodiment provides greater uniformity of dispensed fluid on the wafer than the prior art by providing greater amounts of fluid into annular regions of the wafer with greater area.

Figure 28:
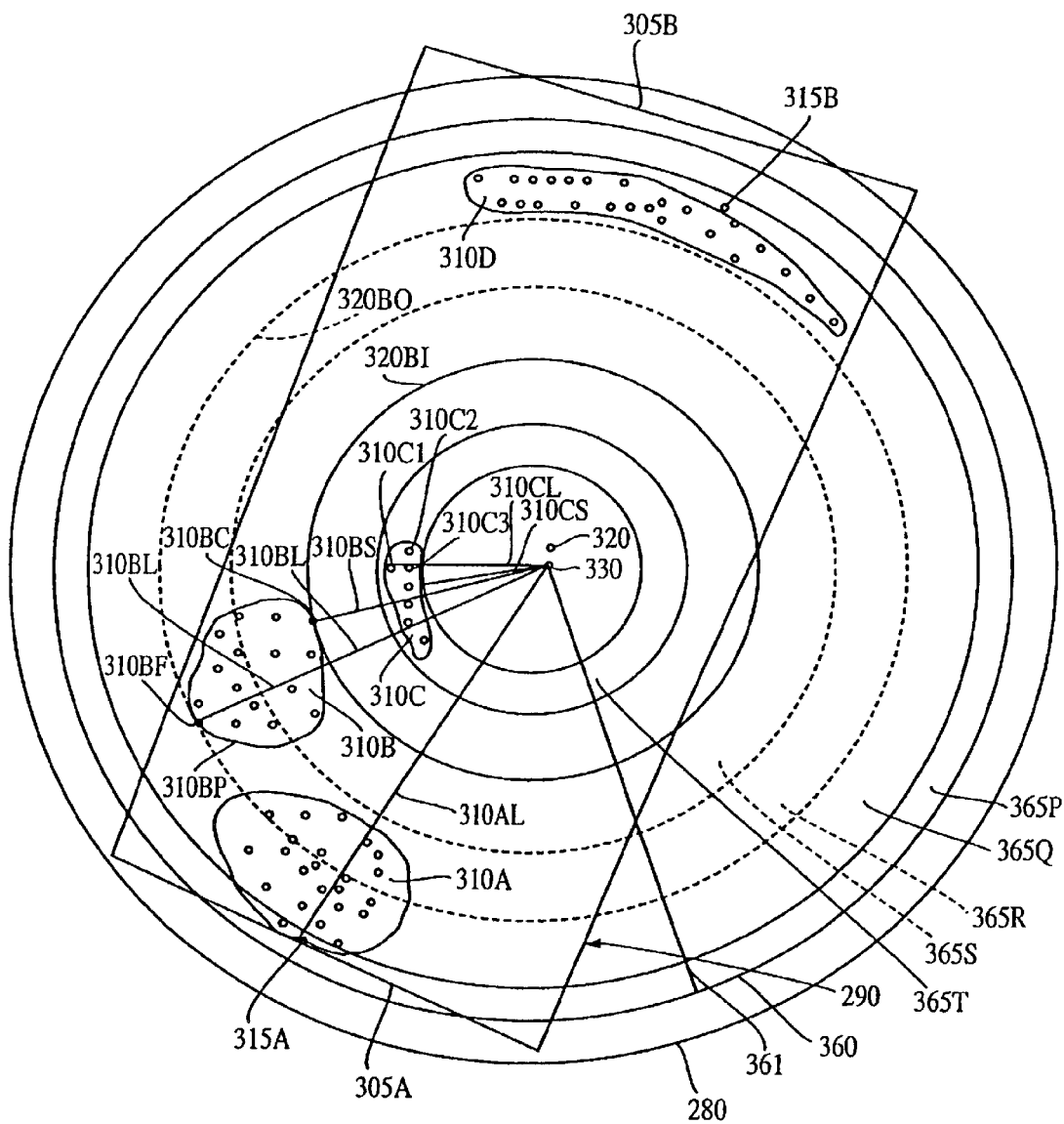
FIG. 28 is a bottom plan view of an alternative embodiment of the general-purpose (full) nozzle showing concentric annuluses used for measuring fluid flow.

An alternative version of this embodiment of the invention provides an even closer match between the amount of fluid dispensed onto the annular regions of the wafer and the area of those regions. The extent to which the desired uniform dispensing of fluid onto a wafer results can be measured by defining concentric annuluses using physical distances determined by the structure of the nozzle. FIG. 28 depicts the general-purpose (full) nozzle 290 again, but this time with a variety of concentric annuluses, e.g., 365P–T, drawn. In this version, although depicted as circles, it will be appreciated by those of skill in the art that more generally the orifices, e.g., 310C1, 310C2, 310C3, are merely two-dimensional with a variety of possible non-circular shapes and have an approximate center. The center of the concentric annuluses is the middle point 330.

To assist in defining the concentric annuluses, a long distance, e.g., 310BL, for each bottom subregion is defined as the distance from the middle point to one 310BF of that one or more points on the perimeter 310BF of that subregion which are furthest from the middle point. Similarly, a short distance, e.g., 310BS, for each bottom subregion is defined as the distance from the middle point to one 310BC of that one or more points on the perimeter of that subregion which are closest to the middle point. To further assist the defining of the concentric annuluses, a flow circle 360 is defined as the circle with the middle point as its center and having a radius 361 greater than or substantially equal to the long distance 310AL for the first perimeter subregion.

Defining the concentric circles is more difficult for this embodiment than the earlier ones due to possible overlap of geometric areas. The defining process has three steps.

First a "concentric annulus" is defined as an annulus (e.g., the area enclosed by inner perimeter 320BI and outer perimeter 320BO which is a combination of areas 365R,S in the flow circle) with a center at the middle point, with an outer radius equal to the long distance 310BL for a bottom subregion, e.g., 310B, not containing the middle point 330, and with an inner radius equal to the short distance 310BS for that bottom subregion. The annulus is said to correspond to that bottom subregion. The special case where there is a bottom subregion containing the middle point will be described below.

Second, a "simple annulus" is defined as an annulus of the flow circle comprising both (i) any group of two or more concentric annuluses, each of which contains, is contained in (area 365Q is contained in the combination of areas 365Q, R), is identical to, or substantially overlaps (the combination of areas 365Q,R overlaps the combination of areas 365R,S) at least one other concentric annulus within such group, as well as (ii) any one concentric annulus (area 365T) not containing, not contained in, not identical to, and not substantially overlapping any other concentric annulus.

Third, a "bottom simple subregion" is defined as any group of one 310C or more (310A,B,D) bottom subregions corresponding, respectively, to the one (the area 365T) or more (the multiple concentric annuluses comprising the area 365Q as one concentric annulus, the areas 365Q,R, in combination as another concentric annulus, and the areas 365R,S in combination as yet another concentric annulus) concentric annuluses which together comprise a simple annulus. That bottom simple subregion is said to correspond to that simple annulus. Thus, the bottom simple subregion 310A,B,D corresponds to the simple annulus determined by radii 310AL and 310BS, while the bottom simple subregion 365T corresponds to the simple annulus 365T determined by radii 310CS and 310CL.

The measurement of uniform dispensing of fluid onto a wafer is accomplished by measuring the combined volume of fluid flow per unit time through the orifices, e.g., 365C1, 2,3, in each bottom simple subregion, e.g., 310C,and comparing that volume to the area of the corresponding simple annulus 365T. The areas of the orifices can be selected by methods well known in the art to produce a volume of fluid flow per unit time dispensed in the aggregate through the orifices in each bottom simple subregion proportional to the area of the simple annulus, all with the same proportionality constant. The areas of the orifices are one nozzle characteristic that can produce the proportional variation in, and affect, the volume of fluid flow just described. However, it will be appreciated by those of ordinary skill in the art that other characteristics of the nozzle, including its nozzle tips and small passages as well as the diameters of the orifices, can produce pressure, viscosity and other physical effects with the same proportional variation.

Figure 29:
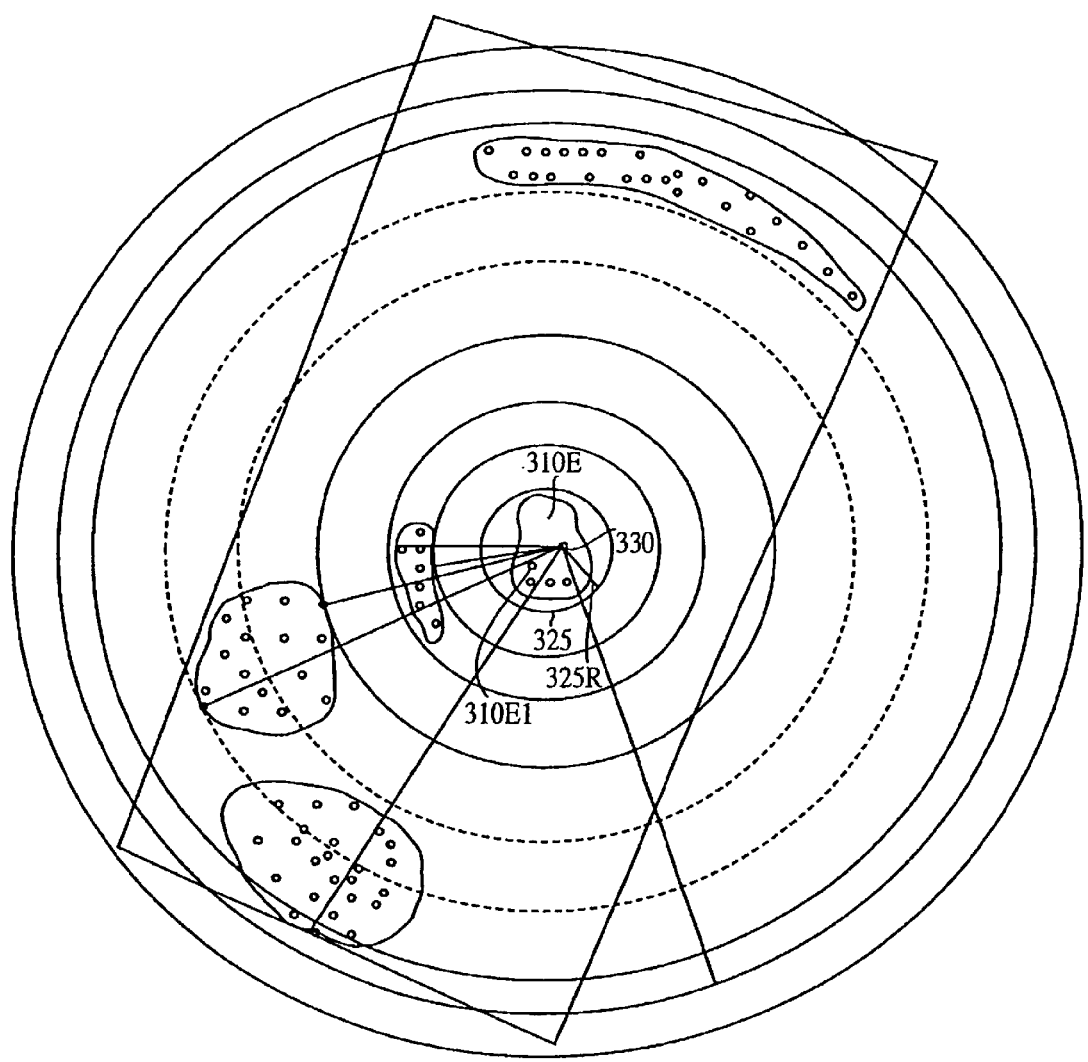
FIG. 29 is a bottom plan view of the alternative embodiment of the general-purpose (full) nozzle showing concentric annuluses used for measuring fluid flow for the case where a bottom subregion contains the middle point.
Figure 31:
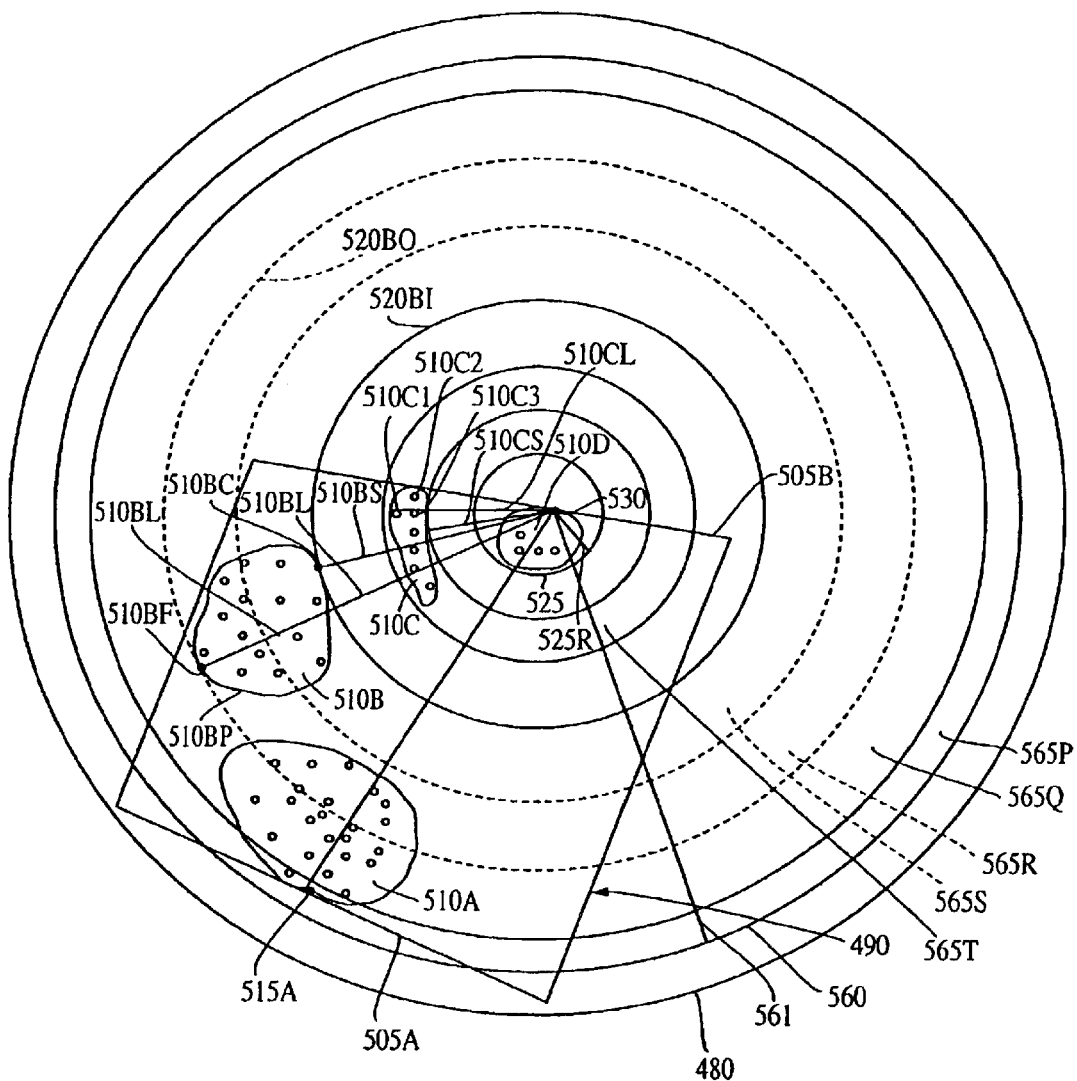
FIG. 31 is a bottom plan view of an alternative embodiment of the general-purpose (half) nozzle showing concentric annuluses used for measuring fluid flow.

For the special case depicted in FIG. 29 showing the same nozzle as in FIG. 28, but with a bottom subregion 310E containing the middle point 330, no concentric or simple annulus or bottom simple subregion is defined by the dimensions of that bottom subregion 310E. Instead, a central circle 325 is defined as the circle having a center at the middle point 330 and a radius equal to the long distance 325R of the bottom subregion containing the middle point. Assume for the moment (as depicted in FIG. 31) that no simple annulus substantially overlays the central circle 325. In this special case, the characteristics of that bottom subregion (e.g., its number of orifices or their area) are selected so that the total volume of fluid flow per unit time through the orifices, e.g., 310E1, in that bottom subregion 310E is substantially proportional to the area of the central circle 325 with the same proportionality constant described above for the simple annuluses.

If the assumption is false for this special bottom subregion 310E and there is a substantially overlapping simple annulus (not depicted), the central circle 325 must be expanded to define a circle that will include that simple annulus. From the foregoing teachings regarding the definitions of simple annulus and bottom simple subregion and their use to account for overlap, it will be apparent to those of skill in the art how to perform that expansion and it will also be apparent to those of skill in the art how to select the area of the orifices in the bottom simple subregions and the characteristics of the bottom subregions defining the expanded central circle, all to the end that the same proportionalities of fluid flow to areas are achieved. In fact, the claims associated with this embodiment describe in detail that very expansion and selection process.

A sixth embodiment of the invention, called the general-purpose (half) nozzle has perspective and cross section views of the general-purpose (half) nozzle substantially identical to those depicted in FIGS. 24, 25, and 26 for the general-purpose (full) nozzle.

Figure 30:
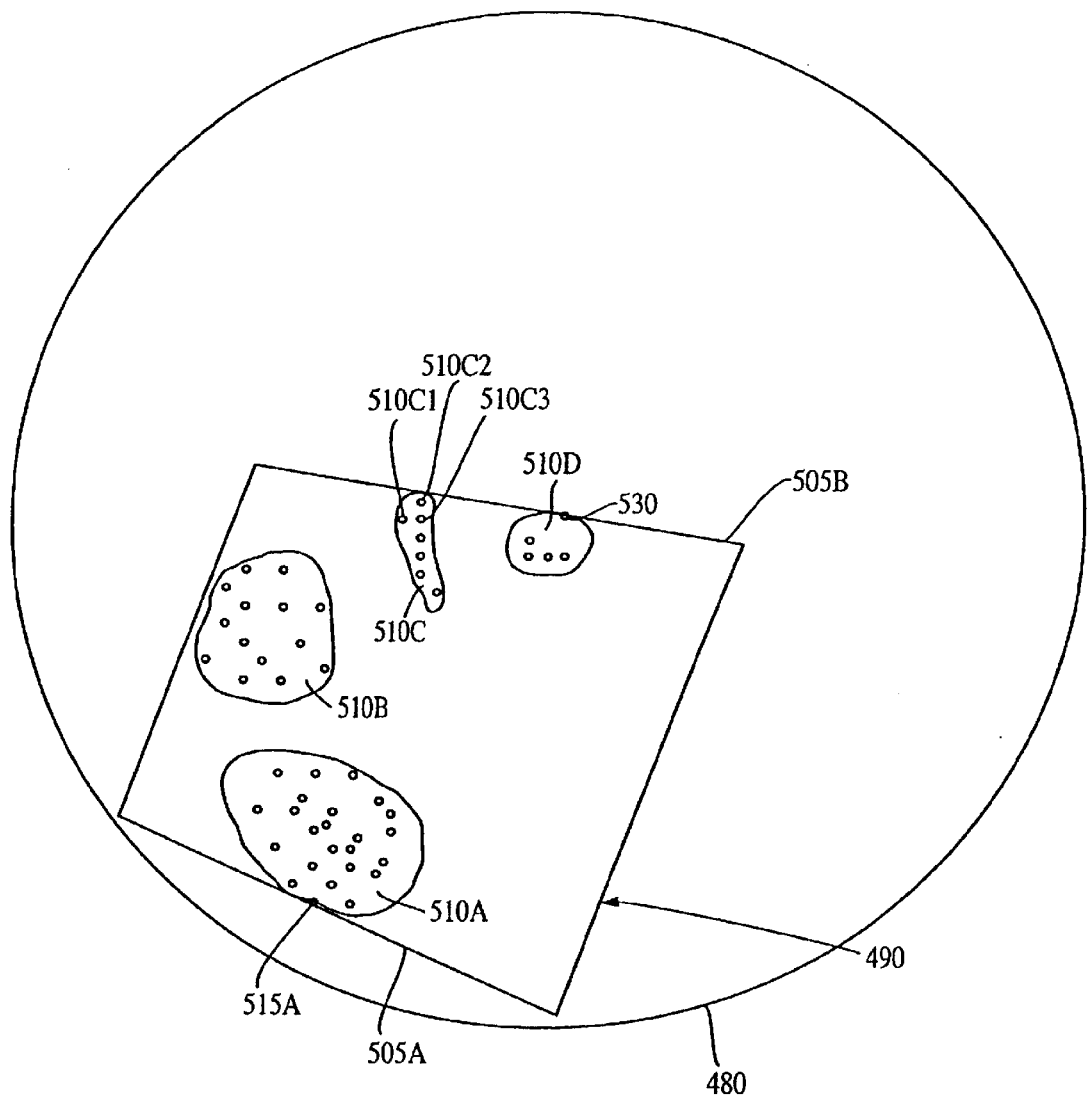
FIG. 30 is a bottom plan view of the sixth embodiment of the invention, called a general-purpose (half) nozzle, looking upward from a wafer disposed below the general-purpose (half) nozzle and showing its orifices.

FIG. 30, in bottom plan view looking upwards from a rotating wafer 480 below the nozzle 490, shows the general-purpose (half) nozzle 490 and orifices, e.g., 510C1, 510C2, 510C3. In this view and this orientation of the nozzle with respect to the wafer, the orifices face the wafer sufficiently to allow fluid dispensed from the orifices to contact the wafer surface with minimal disturbance of the desired dispensing process. Although the orifices, e.g., 510C1, 510C2, 510C3, are depicted in FIG. 30 as being generally co-planar and circular in shape, it will be appreciated by those of ordinary skill in the art that the bottom may not be planar and the nozzle tip bottom ends in which the orifices are openings may not be co-planar and that the orifice shapes might not be planar or two-dimensional and, even if two-dimensional and planar, might be semi-circular, elliptical, square or hexagonal in shape or of some other shape altogether. The nozzle 490, when placed over the wafer 480, extends about one wafer radial length from the center of the wafer (not shown) to the perimeter of the wafer 480.

For measurement convenience, several geometrical features of the bottom are defined. The bottom is subdivided into two or more non-overlapping portions called bottom subregions 510A, B, C, D and one of those is called the first perimeter subregion 510A, which is one of the one or more bottom subregions closest to the first side surface 505A, while the second perimeter subregion 510D is one of the one or more bottom subregions closest to the second side surface 505B. Each orifice is wholly contained within one of the bottom subregions and each bottom subregion contains at least one orifice.

In addition to the bottom subregions, special points are isolated. The first perimeter point 515A is one of the one or more points on the first perimeter subregion closest to the first side surface 505A. The central point 530 lies on the bottom and is one of the one or more points on the second perimeter subregion 510D closest to the second side surface 505B.

The characteristics of the nozzle are selected so that the aggregate volume of fluid flow per unit time through all the orifices in a given bottom subregion, e.g., 510B, are greater than or substantially equal to such flow through all the orifices in any other bottom subregion, e.g., 510C, closer to the central point 530 than the given bottom subregion. As depicted in FIG. 30, the numbers of the circular orifices are generally larger in bottom subregions further from the central point. This increasing number of orifices is one nozzle characteristic that can produce the result of generally increasing, or non-decreasing, volume of fluid flow just described. However, it will be appreciated by those of ordinary skill in the art that other characteristics of the nozzle, including its nozzle tips and small passages as well as the diameters of the orifices, can produce pressure, viscosity and other physical effects with the same result.

More particularly, this embodiment can be employed so that the central point 530 lies approximately over the center of the wafer (not depicted). So utilized, this embodiment provides greater uniformity of dispensed fluid on the wafer than the prior art by providing greater amounts of fluid into annular regions of the wafer with greater area.

An alternative version of this embodiment of the invention provides an even closer match between the amount of fluid dispensed onto the annular regions of the wafer and the area of those regions. The extent to which the desired uniform dispensing of fluid onto a wafer results can be measured by defining concentric annuluses using physical distances determined by the structure of the nozzle. FIG. 31 depicts the general-purpose nozzle (half) 490 again, but this time with a variety of concentric annuluses, e.g., 565P–T, drawn. In this version, although depicted as circles, it will be appreciated by those of skill in the art that more generally the orifices, e.g., 510C1, 510C2, 510C3, are merely two-dimensional with a variety of possible non-circular shapes and have an approximate center. The center of the concentric annuluses is the central point 530.

To assist in defining the concentric annuluses, a long distance, e.g., 510BL, for each bottom subregion is defined as the distance from the central point to one 510BF of that one or more points on the perimeter 510BP of that subregion which are furthest from the central point. Similarly, a short distance, e.g., 510BS, for each bottom subregion is defined as the distance from the central point to one 510BC of that one or more points on the perimeter of that subregion which are closest to the central point. To further assist the defining of the concentric annuluses, a flow circle 560 is defined as the circle with the central point as its center and having a radius 561 greater than or substantially equal to the long distance 510AL for the first perimeter subregion.

Defining the concentric circles is more difficult for this embodiment than the earlier ones due to possible overlap of geometric areas. The defining process has three steps.

First a "concentric annulus" is defined as an annulus (e.g., the area enclosed by inner perimeter 520BI and outer perimeter 520BO which is a combination of areas 565R,S in the flow circle) with a center at the central point, with an outer radius equal to the long distance 510BL for a bottom subregion, e.g., 510B, not containing the central point, and with an inner radius equal to the short distance 510BS for that bottom subregion. The annulus is said to correspond to that bottom subregion. The bottom subregion 510D containing the central point 530 will be disregarded temporarily.

Second, a "simple annulus" is defined as an annulus of the flow circle comprising both (i) any group of two or more concentric annuluses, each of which contains, is contained in, is identical to, or substantially overlaps (the combination of areas 565Q,R overlaps the combination of areas 565R, S at least one other concentric annulus within such group, as well as (ii) any one concentric annulus area 565T not containing, not contained in, not identical to, and not substantially overlapping any other concentric annulus.

Third, a "bottom simple subregion" is defined as any group of one 510C or more bottom subregions corresponding to the one (the area 565T) or more (the multiple concentric annuluses comprising the areas 565Q,R in combination as one concentric annulus and the areas 565R,S in combination as another concentric annulus) concentric annuluses which together comprise a simple annulus. That bottom simple subregion is said to correspond to that simple annulus. Thus the bottom simple subregion 553 10A,B, corresponds to the simple annulus determined by radii 510AL and 510BS, while the bottom simple subregion 565T corresponds to the simple annulus determined by radii 510CS and 510CL.

The measurement of uniform dispensing of fluid onto a wafer is accomplished by measuring the combined volume of fluid flow per unit time through the orifices, e.g., 510C1, 2, 3, in each bottom simple subregion, e.g., 510C, and comparing that volume to the area of the corresponding simple annulus 565T. The areas of the orifices can be selected by methods well known in the art to produce a volume of fluid flow per unit time dispensed in the aggregate through the orifices in each bottom simple subregion proportional to the area of the simple annulus, all with the same proportionality constant. The areas of the orifices are one nozzle characteristic that can produce the proportional variation in, and affect, the volume of fluid flow just described. However, it will be appreciated by those of ordinary skill in the art that other characteristics of the nozzle, including its nozzle tips and small passages as well as the diameters of the orifices, can produce pressure, viscosity and other physical effects with the same proportional variation.

The special bottom subregion 510D containing the central point 530 was temporarily disregarded. No concentric or simple annulus, or bottom simple subregion is defined by the dimensions of that bottom subregion 510D. Instead, a central circle 525 defined as the circle having a center at the central point 530 and a radius equal to the long distance 525R of the bottom subregion containing the central point. Assume for the moment (as depicted in FIG. 31) that no simple annulus substantially overlays the central circle 525. For this special bottom subregion, the characteristics of that bottom subregion (e.g., its number of orifices or their area) are selected so that the total volume of fluid flow per unit time through the orifices in that bottom subregion 510D is substantially proportional to the area of the central circle 525 with the same proportionality constant described above for the simple annuluses.

If the assumption is false for this special bottom subregion 510D and there is a substantially overlapping simple annulus (not depicted), the central circle 525 must be expanded to define a circle that will include that simple annulus. From the foregoing teachings regarding the definitions of simple annulus and bottom simple subregion and their use to account for overlap, it will be apparent to those of skill in the art how to perform that expansion and it will also be apparent to those of skill in the art how to select the area of the orifices in the bottom simple subregions and the characteristics of the bottom subregions defining the expanded central circle, all to the end that the same proportionalities of fluid flow to areas are achieved. In fact, the claims associated with this embodiment describe in detail that very expansion and selection process.

The various embodiments of the invention have many physical characteristics in common, such as the composition of materials forming the vessel, orifice size and the like, as will be appreciated by those of skill in the art, and those characteristics will be apparent to those of such skill. For example, the height of the block or wedge embodiments will typically be in the approximate range of ¾"–1½", the fluid supply also used with the embodiments will typically be in the approximate range of ⅛"–¼" or greater in diameter, the inlet fittings will typically be at one end or another of the top surface or on an upper portion of the side surfaces, the orifice diameters will typically be in the approximate range of 0.1 mm-5 mm, perhaps most effectively at about 0.5 mm. The nozzle tip will have a height in the approximate range of 1 mm-2 mm. The arc angle formed by the wedge shape will typically be in the range of approximately 15°–45°.

The nozzles are generally fabricated of plastics that are both mechanically stable and resistant to chemical attack, characteristics well known to those of skill in the art. The nozzle is usually fabricated in two monolithic pieces: the top surface and the remainder of the nozzle.

Typically, the nozzle is positioned above the wafer below a distance ranging between 1 mm and 1 cm.

What is claimed is:

1. A nozzle for use in applying fluid to a round surface comprising:
    a vessel having a total surface and an interior, the total surface having a top surface and a bottom;
    a plurality of orifices disposed on the bottom of the vessel, the orifices being in fluid communication with the vessel's interior and being configured to permit a flow of the fluid to outside the vessel from the interior of the vessel;
    one or more arcs substantially circular in shape; and
    the orifices being disposed substantially along the one or more arcs, wherein the one or more arcs is a plurality of arcs; and
    further comprising:
        a reference line generally perpendicular to the bottom;
        a reference point situated on or in proximity to the bottom and lying on the reference line; and
        the plurality of arcs not intersecting each other, each arc having a center lying substantially on the reference line, and each arc being defined by an arc radius.

2. The nozzle according to claim 1, wherein the aggregate volume of fluid flow per unit time through the orifices corresponding to one arc defined by its arc radius is greater than or substantially equal to the aggregate volume of fluid flow per unit time through the orifices corresponding to another arc with a smaller arc radius.

3. The nozzle according to claim 2, further comprising:
    one or more inlet fittings disposed on the top surface in fluid communication with the vessel's interior and configured to receive fluid from outside the vessel; and
    a support disposed on the top surface and adapted for attachment external to the vessel to physically support the vessel.

4. The nozzle according to claim 2, further comprising:
    one or more inlet fittings disposed on the total surface other than on the top surface, such one or more inlet fittings being in fluid communication with the vessel's interior and configured to receive fluid from outside the vessel, and
    a support disposed on the top surface and adapted for attachment external to the vessel to physically support the vessel.

5. The nozzle according to claim 1:
    wherein the plurality of arcs is two arcs; and
    further comprising:
        a perimeter curve comprising the arc having the longest arc radius;
        a central curve comprising the arc closest to the reference point;
        a flow circle radius, the flow circle radius being a distance greater than or substantially equal to the distance from the reference point to one of the points furthest from the reference point of all of the points on the orifices corresponding to the perimeter curve;
        a flow circle defined by a radius equal to the flow circle radius and a center at the reference point;
        a midway circle lying within the flow circle, the midway circle having a substantially circular shape, a center at the reference point and a radius substantially halfway in length between the lengths of the arc radiuses defining the perimeter curve and the central curve;
        a perimeter annulus within the flow circle defined by a center at the reference point and by the midway circle and the perimeter of the flow circle; and
        the characteristics of the nozzle being such that the aggregate volume of fluid flow per unit time through the one or more orifices disposed along the perimeter curve and the aggregate volume of fluid flow per unit time through the one or more orifices disposed along the central curve are substantially proportional to the area of the perimeter annulus and to the area of the midway circle, respectively, with the same proportionality constant.

6. The nozzle according to claim 1:
    wherein the plurality of arcs comprises three or more arcs; and
    further comprising:
        a perimeter curve comprising the arc having the longest arc radius;
        a central curve comprising the arc closest to the reference point;
        a flow circle radius, the flow circle radius being a distance greater than or substantially equal to the distance from the reference point to one of the points furthest from the reference point of all of the points on the orifices corresponding to the perimeter curve;
        a flow circle defined by a radius equal to the flow circle radius and a center at the reference point;
        adjacent arcs comprising two arcs defined respectively by two arc radiuses of successively greater length;
        an arc triplet comprising three arcs defined respectively by three arc radiuses of successively greater length, the inside arcs of such arc triplet being the two arcs of such arc triplet with the smallest two arc radiuses, the outside arcs of such arc triplet being the two arcs with the largest two arc radiuses, and the middle arc of such arc triplet being the arc with the arc radius of length between the lengths of the other two arc radiuses in such arc triplet;
        a halfway circle lying within the flow circle, the halfway circle having a substantially circular shape and a radius substantially halfway in length between the lengths of the arc radiuses defining adjacent arcs;
        an inner annular perimeter comprising that halfway circle of any two adjacent halfway circles which is closer to the reference point, the inner annular perimeter corresponding to that arc which is the middle arc of that arc triplet whose two inside arcs define such closer halfway circle;
        an outer annular perimeter comprising that halfway circle of any two adjacent halfway circles which is further from the reference point, the outer annular perimeter corresponding to that arc which is the middle arc of that arc triplet whose two outside arcs define such further halfway circle;

an inner final perimeter comprising the halfway circle furthest from the reference point;

an outer final perimeter comprising the perimeter of the flow circle;

an interior annulus within the flow circle defined by a center at the reference point and by an inner annular perimeter corresponding to an arc and the outer annular perimeter corresponding to said arc, the interior annulus corresponding to said arc;

a perimeter annulus within the flow circle defined by a center at the reference point and by the inner final perimeter and the outer final perimeter, the perimeter annulus corresponding to the perimeter curve;

one or more concentric annuluses corresponding to an arc, the concentric annuluses comprising the perimeter annulus corresponding to the perimeter curve and any interior annulus corresponding to any arc other than the perimeter curve;

a central circle within the flow circle defined by a perimeter identical to the halfway circle closest to the reference point and by a center at the reference point;

the characteristics of the nozzle being such that the aggregate volume of fluid flow per unit time through the one or more orifices disposed along the arc corresponding to a concentric annulus is substantially proportional to the area of such concentric annulus with a proportionality constant; and the characteristics of the nozzle being such that the aggregate volume of fluid flow per unit time through the one or more orifices disposed along the central curve is substantially proportional to the area of the central circle with said proportionality constant.

7. The nozzle according to claim 6, wherein:

the characteristics of the nozzle affecting the aggregate volume of fluid flow per unit time through the one or more orifices disposed along the arc corresponding to a concentric annulus are such one or more orifices disposed along the arc corresponding to such concentric annulus; and the characteristics of the nozzle affecting the aggregate volume of fluid flow per unit time through the one or more orifices disposed along the central curve are such one or more orifices disposed along the central curve.

8. The nozzle according to claim 7, wherein:

each of the orifices defines a substantially two-dimensional shape;

the characteristics of the nozzle affecting the aggregate volume of fluid flow per unit time through the one or more orifices disposed along the arc corresponding to a concentric annulus are the areas of such one or more orifices disposed along the arc corresponding to such concentric annulus; and the characteristics of the nozzle affecting the aggregate volume of fluid flow per unit time through the one or more orifices disposed along the central curve are the areas of such one or more orifices disposed along the central curve.

9. A nozzle for use in applying fluid to a round surface comprising:

a vessel having a total surface and an interior, the total surface having a top surface and a bottom;

a plurality of orifices disposed on the bottom of the vessel, the orifices being in fluid communication with the vessel's interior and being configured to permit a flow of the fluid to outside the vessel from the interior of the vessel;

one or more arcs substantially circular in shape; and the orifices being disposed substantially along the one or more arcs, wherein the one or more arcs is a plurality of arcs; and further comprising:

a reference line generally perpendicular to the bottom;

a reference point situated on or in proximity to the bottom and lying on the reference line; and the plurality of arcs not intersecting each other, each arc having a center lying substantially on the reference line, and each arc being defined by an arc radius, and wherein the one or more arcs comprises three or more arcs; and further comprising:

a perimeter curve comprising the arc having the longest arc radius;

a central curve comprising the arc closest to the reference point;

a flow circle radius, the flow circle radius being a distance greater than or substantially equal to the distance from the reference point to one of the points furthest from the reference point of all of the points on the orifices corresponding to the perimeter curve;

a flow circle defined by a radius equal to the flow circle radius and a center at the reference point;

adjacent arcs comprising two arcs defined respectively by two arc radiuses of successively greater length;

an arc triplet comprising three arcs defined respectively by three arc radiuses of successively greater length, the inside arcs of such arc triplet being the two arcs of such arc triplet with the smallest two arc radiuses, the outside arcs of such arc triplet being the two arcs with the largest two arc radiuses, and the middle arc of such arc triplet being the arc with the arc radius of length between the lengths of the other two arc radiuses in such arc triplet;

a halfway circle lying within the flow circle, the halfway circle having a substantially circular shape and a radius substantially halfway in length between the lengths of the arc radiuses defining adjacent arcs;

an inner annular perimeter comprising that halfway circle of any two adjacent halfway circles which is closer to the reference point, the inner annular perimeter corresponding to that arc which is the middle arc of that arc triplet whose two inside arcs define such closer halfway circle;

an outer annular perimeter comprising that halfway circle of any two adjacent halfway circles which is further from the reference point, the outer annular perimeter corresponding to that arc which is the middle arc of that arc triplet whose two outside arcs define such further halfway circle;

an inner final perimeter comprising the halfway circle furthest from the reference point;

an outer final perimeter comprising the perimeter of the flow circle;

an interior annulus within the flow circle defined by a center at the reference point and by an inner annular perimeter corresponding to an arc and the outer annular perimeter corresponding to said arc, the interior annulus corresponding to said arc;

a perimeter annulus within the flow circle defined by a center at the reference point and by the inner final perimeter and the outer final perimeter, the perimeter annulus corresponding to the perimeter curve;

one or more concentric annuluses corresponding to an arc, the concentric annuluses comprising the perimeter annulus corresponding to the perimeter curve and any interior annulus corresponding to any arc other than the perimeter curve;

a central circle within the flow circle defined by a perimeter identical to the halfway circle closest to the reference point and by a center at the reference point;

the characteristics of the nozzle being such that the aggregate volume of fluid flow per unit time through the one or more orifices disposed along the arc corresponding to a concentric annulus is substantially proportional to the area of such concentric annulus with a proportionality constant; and the characteristics of the nozzle being such that the aggregate volume of fluid flow per unit time through the one or more orifices disposed along the central curve is substantially proportional to the area of the central circle with said proportionality constant, wherein the bottom includes:

a first side edge;

a second side edge;

a middle side edge between the first side edge and the second side edge;

a perimeter edge longer than the middle side edge; and the perimeter edge and the three side edges defining the perimeter of the bottom.

10. The nozzle according to claim 9, wherein the middle side edge is smaller than the first side edge and the second side edge.

11. The nozzle according to claim 10, wherein the perimeter edge is arc-shaped.

12. The nozzle according to claim 11, wherein the middle side edge is substantially smaller than the first side edge and the second side edge.

13. The nozzle according to claim 11, wherein the middle side edge is substantially a point and the reference point is situated at or in proximity to the middle side edge.

14. The nozzle according to claim 13, further comprising:

one or more inlet fittings disposed on the top surface in fluid communication with the vessel's interior and configured to receive fluid from outside the vessel; and a support disposed on the top surface and adapted for attachment external to the vessel to physically support the vessel.

15. The nozzle according to claim 14, further comprising an air outlet disposed on the top surface of the vessel and configured to permit the escape of gases within the interior of the vessel.

16. The nozzle according to claim 13, further comprising:

one or more inlet fittings disposed on the total surface other than on the top surface, such one or more inlet fittings being in fluid communication with the vessel's interior and configured to receive fluid from outside the vessel; and a support disposed on the top surface and adapted for attachment external to the vessel to physically support the vessel.

17. The nozzle according to claim 16, further comprising an air outlet disposed on the top surface of the vessel and configured to permit the escape of gases within the interior of the vessel.

18. The nozzle according to claim 13, wherein:

each of the orifices defines a substantially two-dimensional shape and has an approximate center; and the center-to-center distance between the openings of adjacent orifices disposed along each arc is substantially identical for all orifices disposed along such arc.

19. The nozzle according to claim 18, further comprising:

one or more inlet fittings disposed on the top surface in fluid communication with the vessel's interior and configured to receive fluid from outside the vessel; and a support disposed on the top surface and adapted for attachment external to the vessel to physically support the vessel.

20. The nozzle according to claim 19, further comprising an air outlet disposed on the top surface of the vessel and configured to permit the escape of gases within the interior of the vessel.

21. The nozzle according to claim 18, further comprising:

one or more inlet fittings disposed on the total surface other than on the top surface, such one or more inlet fittings being in fluid communication with the vessel's interior and configured to receive fluid from outside the vessel; and a support disposed on the top surface and adapted for attachment external to the vessel to physically support the vessel.

22. The nozzle according to claim 21, further comprising an air outlet disposed on the top surface of the vessel and configured to permit the escape of gases within the interior of the vessel.

23. The nozzle according to claim 13, wherein:

the openings of the orifices are approximately circular in shape and substantially equal in diameter;

the round surface is a semiconductor wafer;

the characteristics of the nozzle affecting the aggregate volume of fluid flow per unit time through the one or more orifices disposed along the arc corresponding to a concentric annulus are the number of such one or more orifices disposed along the arc corresponding to such concentric annulus; and the characteristics of the nozzle affecting the aggregate volume of fluid flow per unit time through the one or more orifices disposed along the central curve are the number of such one or more orifices disposed along the central curve the round surface is a semiconductor wafer.

24. The nozzle according to claim 23, further comprising:

one or more inlet fittings disposed on the top surface in fluid communication with the vessel's interior and configured to receive fluid from outside the vessel; and a support disposed on the top surface and adapted for attachment external to the vessel to physically support the vessel.

25. The nozzle according to claim 24, further comprising an air outlet disposed on the top surface of the vessel and configured to permit the escape of gases within the interior of the vessel.

26. The nozzle according to claim 23, further comprising:

one or more inlet fittings disposed on the total surface other than on the top surface, such one or more inlet fittings being in fluid communication with the vessel's interior and configured to receive fluid from outside the vessel; and a support disposed on the top surface and adapted for attachment external to the vessel to physically support the vessel.

27. The nozzle according to claim 26, further comprising an air outlet disposed on the top surface of the vessel and configured to permit the escape of gases within the interior of the vessel.

28. The nozzle according to claim 13, wherein:

the openings of the orifices are approximately circular in shape and substantially equal in diameter;

the round surface is a semiconductor wafer;

the characteristics of the nozzle affecting the aggregate volume of fluid flow per unit time through the one or more orifices disposed along the arc corresponding to a concentric annulus are the number of such one or more orifices disposed along the arc corresponding to such concentric annulus; and the characteristics of the nozzle affecting the aggregate volume of fluid flow per unit time through the one or more orifices disposed along the central curve are the number of such one or more orifices disposed along the central curve the round surface is a semiconductor wafer, and wherein the center-to-center distance between the openings of adjacent orifices disposed along each arc is substantially identical for all orifices disposed along such arc.

29. The nozzle according to claim 28, further comprising:

one or more inlet fittings disposed on the top surface in fluid communication with the vessel's interior and configured to receive fluid from outside the vessel; and a support disposed on the top surface and adapted for attachment external to the vessel to physically support the vessel.

30. The nozzle according to claim 28, further comprising:

one or more inlet fittings disposed on the total surface other than on the top surface, such one or more inlet fittings being in fluid communication with the vessel's interior and configured to receive fluid from outside the vessel; and a support disposed on the top surface and adapted for attachment external to the vessel to physically support the vessel.

31. The nozzle according to claim 29, further comprising an air outlet disposed on the top surface of the vessel and configured to permit the escape of gases within the interior of the vessel.

32. The nozzle according to claim 29, further comprising an air outlet disposed on the top surface of the vessel and configured to permit the escape of gases within the interior fo the vessel.

* * * * *